(12) United States Patent
Chen

(10) Patent No.: US 12,464,797 B2
(45) Date of Patent: Nov. 4, 2025

(54) SELF-FILLING SPACER STRUCTURE

(71) Applicant: Taiwan Semiconductor Manufacturing Company, Ltd., Hsinchu (TW)

(72) Inventor: Kaochao Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 711 days.

(21) Appl. No.: 17/673,104

(22) Filed: Feb. 16, 2022

(65) Prior Publication Data

US 2023/0178633 A1 Jun. 8, 2023

Related U.S. Application Data

(60) Provisional application No. 63/287,144, filed on Dec. 8, 2021.

(51) Int. Cl.
*H10D 64/01* (2025.01)
*H01L 21/425* (2006.01)
(Continued)

(52) U.S. Cl.
CPC ......... *H10D 64/021* (2025.01); *H01L 21/425* (2013.01); *H10D 84/0147* (2025.01); *H10D 84/038* (2025.01)

(58) Field of Classification Search
CPC ............... H01L 29/6656; H01L 21/425; H01L 21/823468; H01L 21/02266; H01L 21/31116; H01L 29/404; H01L 29/66575; H01L 29/66659; H01L 29/78; H01L 29/402; H01L 21/28141; H01L 29/4983;
(Continued)

(56) References Cited

U.S. PATENT DOCUMENTS 6,013,580 A * 1/2000 Yanagida ............ H01L 21/0273
216/37
9,431,603 B1 * 8/2016 Hsieh .................... H10N 70/245
(Continued)

FOREIGN PATENT DOCUMENTS

KR 0698084 B1 3/2007
KR 100694979 B1 3/2007
(Continued)

*Primary Examiner* — Britt D Hanley
*Assistant Examiner* — William C. Trice, III
(74) *Attorney, Agent, or Firm* — Eschweiler & Potashnik, LLC

(57) ABSTRACT

The present disclosure relates a method of manufacturing an integrated chip structure. The method forms an intermediate first material layer over a substrate and an intermediate second material layer on the intermediate first material layer. The intermediate second material layer is patterned to form an insulating layer. The intermediate first material layer is patterned to form a first material layer having an outermost sidewall indented inward from an outermost sidewall of the insulating layer. An ion bombardment process is performed on the insulating layer to dislodge one or more atoms from the insulating layer. A re-deposition process is performed to re-deposit the one or more atoms onto the outermost sidewall of the first material layer and to form a self-filling spacer below the insulating layer.

20 Claims, 15 Drawing Sheets

(51) Int. Cl.
  *H10D 84/01* (2025.01)
  *H10D 84/03* (2025.01)
(58) Field of Classification Search
  CPC ...... H10B 61/22; H10B 63/30; H10N 70/011;
       H10N 70/20; H10N 70/801; H10N
       70/826; H10D 64/021; H10D 84/0147;
       H10D 84/038; H10D 30/0221; H10D
       64/111; H10D 30/0223; H10D 30/60;
       H10D 64/112; H10D 64/671
  See application file for complete search history.

(56) References Cited

U.S. PATENT DOCUMENTS

| | | | |
|---|---|---|---|
| 2003/0011080 A1* | 1/2003 | Deshpande | H01L 21/823864 257/E21.64 |
| 2004/0063289 A1* | 4/2004 | Ohta | H01L 21/823814 257/E21.345 |
| 2008/0116493 A1 | 5/2008 | Adkisson et al. | |
| 2008/0220584 A1* | 9/2008 | Kim | H01L 21/76829 257/E21.243 |
| 2011/0241085 A1* | 10/2011 | O'Meara | H01L 29/6659 257/288 |
| 2014/0087535 A1 | 3/2014 | Roh et al. | |
| 2015/0069516 A1 | 3/2015 | Enox et al. | |
| 2016/0276267 A1 | 9/2016 | Lee et al. | |
| 2017/0154891 A1* | 6/2017 | Liao | H10B 41/30 |
| 2017/0263460 A1 | 9/2017 | Ruffell et al. | |
| 2019/0081155 A1* | 3/2019 | Xie | H10D 30/014 |
| 2020/0013878 A1 | 1/2020 | Colombeau et al. | |

FOREIGN PATENT DOCUMENTS

| | | |
|---|---|---|
| TW | 201316417 A | 4/2013 |
| TW | 201616458 A | 5/2016 |

* cited by examiner

SELF-FILLING SPACER STRUCTURE

REFERENCE TO RELATED APPLICATION

This application claims the benefit of U.S. Provisional Application No. 63/287,144, filed on Dec. 8, 2021, the contents of which are hereby incorporated by reference in their entirety.

BACKGROUND

Modern day integrated chips are formed on wafers of semiconductor material using hundreds of sequential process steps. Two process steps that are commonly used in integrated chip fabrication include deposition processes and patterning processes. A deposition process is a process that forms a material over a wafer. A patterning process is a process that forms a mask over a material and subsequently etches the material according to the mask to remove selected parts of the material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
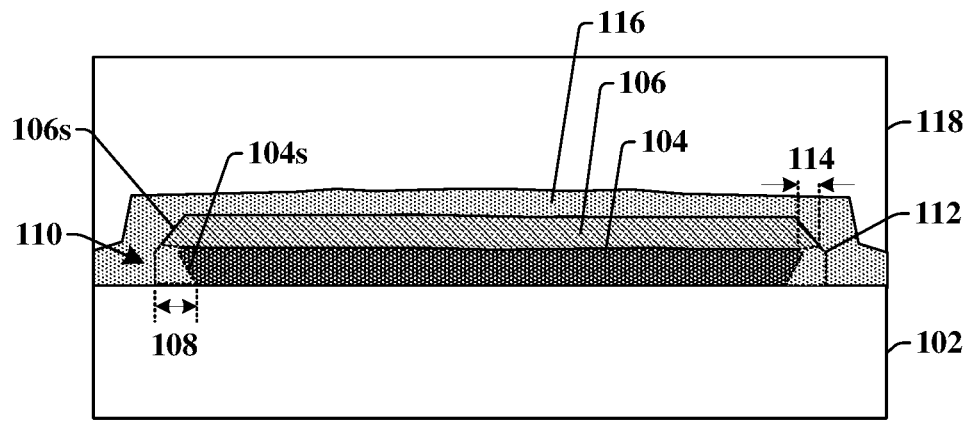
FIG. 1 illustrates a cross-sectional view of some embodiments of an integrated chip structure comprising a dual-film structure having a self-filling spacer that is configured to reduce stress on an overlying layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During formation of an integrated chip structure, a fabrication process may deposit multiple layers onto one another prior to patterning the layers. For example, during the formation of a sidewall spacer a first layer is formed over a substrate and along a side of an electrode (e.g., a gate electrode). A second layer is subsequently formed over the first layer. The first layer and the second layer are then patterned by one or more etching processes to form the sidewall spacer. Due to differences in etching selectivities between the first layer and the second layer, the one or more etching processes may laterally etch the first layer quicker than the second layer. Etching the first layer quicker than the second layer may cause the second layer to overhang the first layer and to form a cavity within a side of the multi-layer structure.

The overhanging of the second layer past the first layer can cause problems during subsequent fabrication processes. For example, when an additional layer is formed onto the first layer and the second layer, the additional layer will continuously form along multiple surfaces (e.g., an upper surface, a lower surface, and a sidewall) of the overhanging part of the second layer. However, as a thickness of the additional layer increases a surface area of the additional layer will increase, and the additional layer will stretch to cover the greater surface area. The stretching of the additional layer causes stress on the additional layer. The stress may cause cracks to form in the additional layer and can lead to structural instability within the integrated chip structure. The structural instability can further lead to reliability problems. For example, when cracks form within walls of a sidewall spacer that are near metal features (e.g., a conductive contact), metal may enter into the cracks resulting in unwanted conductive paths that can lead to reduced reliability (e.g., increased time dependent dielectric breakdown), short circuits, and even yield loss and/or integrated chip failure.

The present disclosure relates to an integrated chip structure comprising a self-filling spacer that is configured to fill a cavity, which was formed within a sidewall of a dual-film structure during an etching process, to mitigate stress on a layer overlying the dual-film structure. In some embodiments, the integrated chip structure may comprise a first material layer disposed over a substrate and having an outermost sidewall. An insulating layer is disposed over the first material layer. The insulating layer laterally extends from directly over the first material layer to laterally past the outermost sidewall of the first material layer, so as to define a cavity that is below the insulating layer. A self-filling spacer is arranged within the cavity. A dielectric layer is arranged over the insulating layer and along sidewalls of the insulating layer and the self-filling spacer. Because the self-filling spacer fills in the cavity below the insulating layer, the dielectric layer does not form along a bottom of the insulating layer, thereby reducing a stress on the dielectric layer. By reducing a stress on the dielectric layer, cracks within the dielectric layer can be mitigated, thereby reducing damage to the dielectric layer and improving a reliability of the integrated chip structure.

FIG. 1 illustrates a cross-sectional view of some embodiments of an integrated chip structure 100 comprising a dual-film structure having a self-filling spacer.

The integrated chip structure 100 comprises a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 102 may comprise one or more dielectric layers, one or more inter-level dielectric (ILD) layers, and/or one or more interconnects disposed over a semiconductor body.

A multi-layer structure is disposed over the substrate 102. The multi-layer structure comprises a first material layer 104 disposed over the substrate 102 and an insulating layer 106 disposed over the first material layer 104. The first material layer 104 and the insulating layer 106 comprise different materials. The first material layer 104 has an outermost sidewall 104s that is indented from (e.g., laterally set back from) an outermost sidewall 106s of the insulating layer 106 by a non-zero distance 108, so that the insulating layer 106 overhangs the first material layer 104. In some embodiments, the non-zero distance 108 may be in a range of between approximately 30% and approximately 100% of a thickness of the first material layer 104. The overhang of the insulating layer 106 forms a cavity 110 that is defined by the outermost sidewall 104s of the first material layer 104 and a lower surface of the insulating layer 106.

A self-filling spacer 112 is arranged within the cavity 110. The self-filling spacer 112 fills the cavity 110 so as to cover the lower surface of the insulating layer 106 and the outermost sidewall 104s of the first material layer 104. In some embodiments, the insulating layer 106 and the self-filling spacer 112 completely cover an outermost edge of the first material layer 104. In such embodiments, the self-filling spacer 112 has a non-zero thickness 114 along the outermost edge of the first material layer 104. In some embodiments, the non-zero thickness is less than the non-zero distance 108. In some embodiments, the insulating layer 106 and the self-filling spacer 112 collectively form a smooth outer surface facing away from the first material layer 104. In some embodiments, the insulating layer 106 and the self-filling spacer 112 comprise a same material that continuously extends from within the insulating layer 106 to along the outermost sidewall 104s of the first material layer 104.

An additional layer is arranged over the insulating layer 106 and along an outermost sidewall of the self-filling spacer 112. In some embodiments, the additional layer may comprise a dielectric layer 116 arranged over the insulating layer 106 and along outermost sidewalls of the insulating layer 106 and the self-filling spacer 112. Because the self-filling spacer 112 fills in the cavity 110 that is below the insulating layer 106, the dielectric layer 116 does not extend along the lower surface of the insulating layer 106. Because the dielectric layer 116 does not extend along the lower surface of the insulating layer 106, a stress on the dielectric layer 116 is mitigated thereby reducing the formation of cracks in the dielectric layer 116. By reducing the formation of cracks in the dielectric layer 116, reliability issues of the integrated chip structure 100 can be mitigated and performance and/or yield of the integrated chip structure 100 can be improved.

Figure 2A:
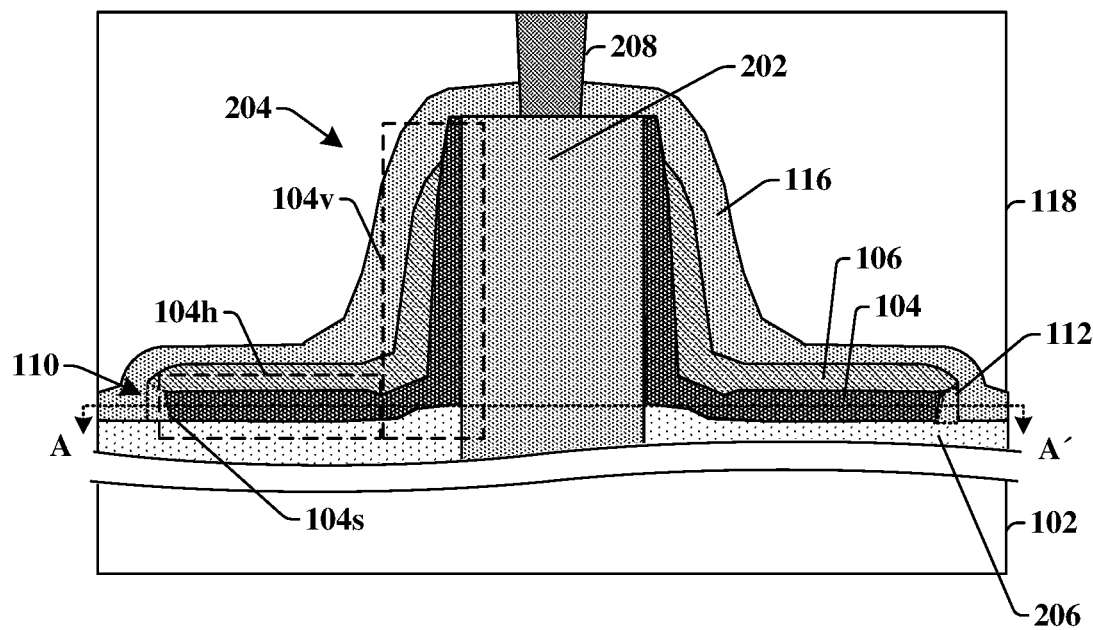
FIGS. 2A-2B illustrate some embodiments of an integrated chip structure comprising a dual-film structure having a self-filling spacer.

FIG. 2A illustrates a cross-sectional view of some embodiments of an integrated chip structure 200 comprising a dual-film structure having a self-filling spacer.

The integrated chip structure 200 comprises a device structure 202 disposed over a substrate 102. In various embodiments, the device structure 202 may comprise a transistor gate structure, a memory device (e.g., a resistive random access memory (RRAM) device, a magneto-resistive random access memory (MRAM) device, a conductive bridging random access memory (CBRAM) device, a magnetic tunnel junction (MTJ) device, etc.), a passive device (e.g., a capacitor, an inductor, etc.), or the like.

A sidewall spacer 204 is arranged on opposing sides of the device structure 202. In some embodiments, the sidewall spacer 204 may comprise a plurality of layers stacked onto one another. For example, in some embodiments the sidewall spacer 204 may comprise a first material layer 104 arranged between a lower dielectric layer 206 and an insulating layer 106. The lower dielectric layer 206 is arranged over the substrate 102 and along a sidewall of the device structure 202. The first material layer 104 is arranged along a sidewall and an upper surface of the lower dielectric layer 206 and the insulating layer 106 is arranged along a sidewall and an upper surface of the first material layer 104. In some embodiments, the first material layer 104 comprises a vertically extending segment 104v extending along the sidewall of the device structure 202 and a horizontally extending segment 104h protruding outward from a sidewall of the vertically extending segment 104v. The first material layer 104 has an outermost sidewall 104s that is laterally indented from an outermost edge of the insulating layer 106 so as to form a cavity 110 below an outer edge of the insulating layer 106.

In some embodiments, the lower dielectric layer 206 may comprise and/or be a first dielectric material such as an oxide (e.g., silicon oxide), a nitride (e.g., silicon nitride), or the like. In some embodiments, the first material layer 104 may comprise and/or be a conductive material or a non-conductive material. For example, in various embodiments the first material layer 104 may comprise and/or be a metal, a metal alloy, an oxide, a nitride, a carbide, an oxynitride, an oxycarbide, a polymer, a metal oxide, a metal nitride, or the like. In some embodiments, the insulating layer 106 may comprise and/or be a second dielectric material such as an oxide (e.g., silicon oxide), a nitride (e.g., silicon nitride), a carbide, an oxynitride, an oxycarbide, a polymer, or the like.

A self-filling spacer 112 is arranged along the outermost sidewall 104s of the first material layer 104 and below a lower surface of the insulating layer 106. The self-filling spacer 112 extends from directly below the lower surface of the insulating layer 106 to an outer edge of the insulating layer 106, so as to fill the cavity 110. In some embodiments, the self-filling spacer 112 may further extend from directly below the first material layer 104 to laterally past an outermost edge of the first material layer 104. The self-filling spacer 112 comprises at least one of the same materials as the insulating layer 106. The self-filling spacer 112 has a first sidewall that faces the first material layer 104 and that contacts a sidewall of the first material layer 104. The self-filling spacer 112 further comprises a second sidewall that faces away from the first material layer 104.

A dielectric layer 116 is arranged on the insulating layer 106 and along the second sidewall of the self-filling spacer 112. In some embodiments, the dielectric layer 116 may comprise a nitride (e.g., silicon nitride, silicon oxynitride, or the like), a carbide (e.g., silicon carbide, silicon oxycarbide, or the like), or other similar materials. In some embodiments, the dielectric layer 116 is configured to act as an etch stop layer. In some embodiments, the outer edge of the insulating layer 106 may be rounded. While a rounded shape of the outer edge of the insulating layer 106 would result in a relatively large stress on the dielectric layer 116 without the self-filling spacer 112 (since it would increase stretching of the dielectric layer 116), the self-filling spacer 112 reduces stress on the dielectric layer 116 by filling the cavity 110 below the insulating layer 106.

An inter-level dielectric (ILD) structure 118 is arranged on the dielectric layer 116. In some embodiments, the ILD structure 118 may comprise one or more of silicon dioxide, carbon doped silicon oxide (SiCOH), phosphosilicate glass (PSG), borophosphosilicate glass (BPSG), fluorosilicate glass (FSG), undoped silicate glass (USG), or the like. The ILD structure 118 laterally surrounds one or more interconnects 208 that extend through the ILD structure 118 to contact the device structure 202 and/or the source/drain regions 308. In some embodiments, the one or more interconnects 208 may comprise conductive contacts. To increase a density of transistor devices within an integrated chip, the one or more interconnects 208 may be disposed at a small distance from an outer sidewall of the sidewall spacer 204 (e.g., from an outer sidewall of the first material layer 104 and/or the insulating layer 106). The self-filling spacer 112 decreases a chance of metal from the one or more interconnects 208 from forming within cracks in the dielectric layer 116, thereby mitigating electrical shorts and/or reliability issues (e.g., time dependent dielectric breakdown) within the integrated chip structure 200.

Figure 2B:
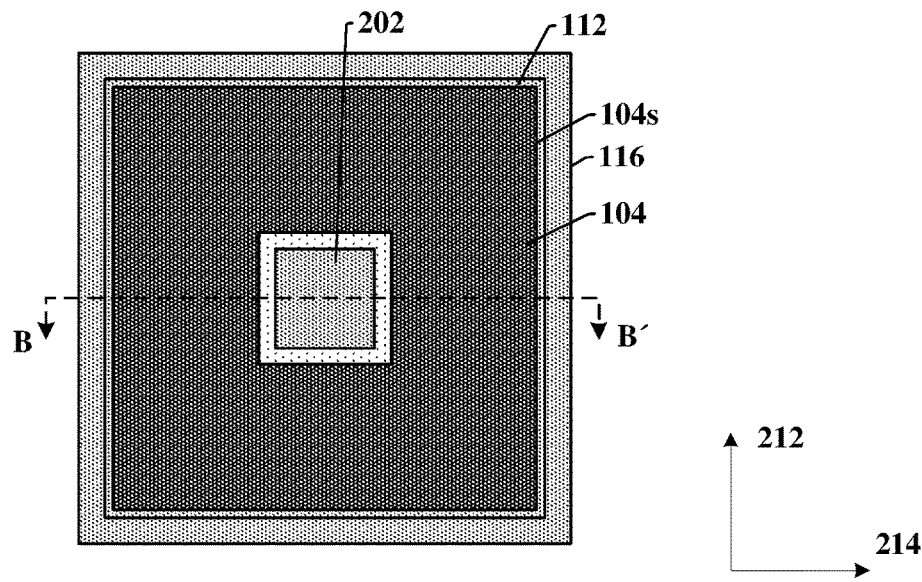

FIG. 2B illustrates a top-view 210 of some embodiments of the integrated chip structure 200 of FIG. 2A. The top-view 210 of FIG. 2B is taken along line A-A' of FIG. 2A, while the cross-sectional view of FIG. 2A is taken along line B-B' of FIG. 2B.

As shown in top-view 210, the first material layer 104 and the self-filling spacer 112 wrap around the device structure 202 in a closed loop. The outermost sidewall 104s of the first material layer 104 extends in a closed path that is directly below the insulating layer (not shown), so that the self-filling spacer 112 continuously extends around an outer perimeter of the first material layer 104 in a ring shape that extends along a first direction 212 and along a second direction 214 that is perpendicular to the first direction 212.

Figure 3A:
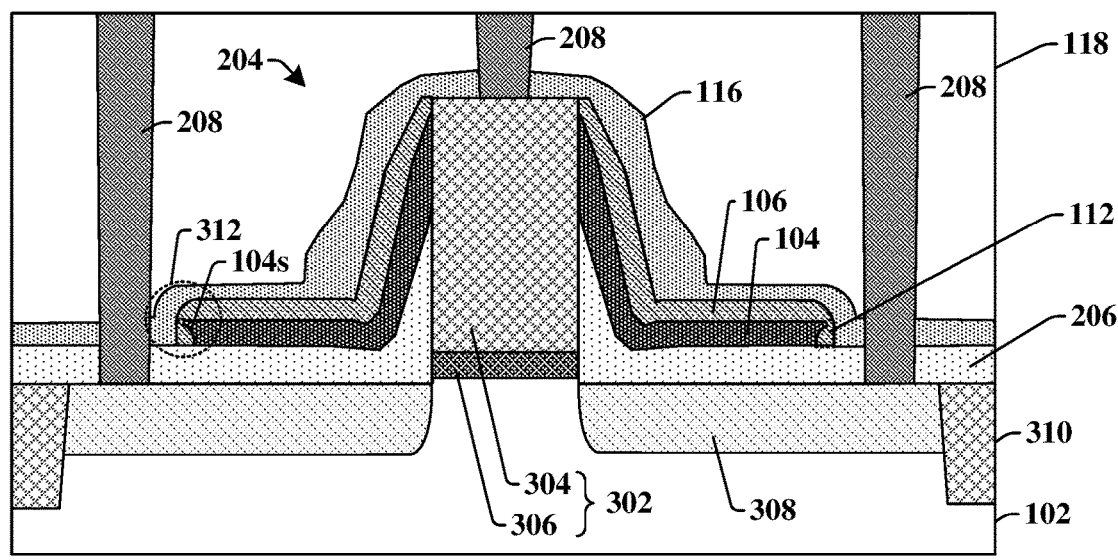
FIGS. 3A-3C illustrate some embodiments of an integrated chip structure comprising a transistor device surrounded by a sidewall spacer having a self-filling spacer.

FIG. 3A illustrates a cross-sectional view of some embodiments of an integrated chip structure 300 comprising a transistor including a sidewall spacer having a self-filling spacer.

The integrated chip structure 300 comprises a transistor device disposed within a substrate 102. The transistor device includes a gate structure 302 disposed over the substrate 102. The gate structure 302 comprises a gate electrode 304 separated from the substrate 102 by a gate dielectric 306. Source/drain regions 308 are disposed within the substrate 102 on opposing sides of the gate structure 302. In some embodiments, one or more isolation structures 310 are disposed within the substrate 102 and surround the source/drain regions 308. In some embodiments, the one or more isolation structures 310 may comprise a shallow trench isolation (STI) structure.

A sidewall spacer 204 is arranged on opposing sides of the gate structure 302. In some embodiments, the sidewall spacer 204 may comprise a first material layer 104 arranged between a lower dielectric layer 206 and an insulating layer 106. The lower dielectric layer 206 is arranged over the substrate 102 and along a sidewall of the device structure 202. The first material layer 104 is arranged along a sidewall and an upper surface of the lower dielectric layer 206 and the insulating layer 106 is arranged along a sidewall and an upper surface of the first material layer 104.

A self-filling spacer 112 is disposed along an outermost sidewall 104s of the first material layer 104 and below a lower surface of the insulating layer 106. In some embodiments, the self-filling spacer 112 may have a substantially triangular shape, as viewed in the cross-sectional view. In other embodiments, the self-filling spacer 112 may have a different shape (e.g., a trapezoidal shape, an inverted trapezoidal shape, an inverted triangular shape, a rectangular shape, a square shape, or the like). A dielectric layer 116 is arranged on the insulating layer 106 and the self-filling spacer 112, and an ILD structure 118 is arranged on the dielectric layer 116.

Figure 3B:
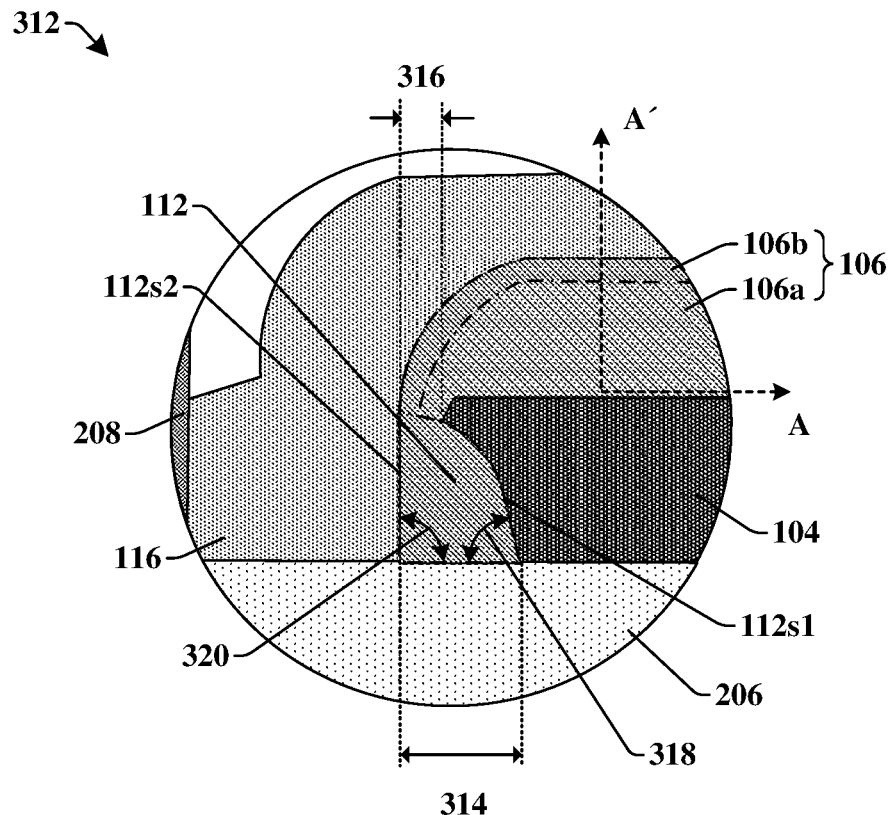

FIG. 3B illustrates a cross-sectional view 312 of a segment of the integrated chip structure 300 shown in FIG. 3A.

As shown in cross-sectional view 312, the self-filling spacer 112 may comprise a bottom that is wider than a top of the self-filling spacer 112. In some embodiments, the self-filling spacer 112 may comprise a bottom surface that has a first width 314. The self-filling spacer 112 extends past an outermost edge of the first material layer 104 by a second distance 316 that is less than the first width 314. In some embodiments, the self-filling spacer 112 may comprise a first sidewall 112s1 facing the first material layer 104 and a second sidewall 112s2 facing away from the first material layer 104. In some embodiments, the first sidewall 112s1 may be a slanted sidewall. For example, the first sidewall 112s1 may be oriented at a first angle 318 that is an acute angle with respect to the bottom surface of the self-filling spacer 112, as measured through the self-filling spacer 112. In some additional embodiments, the first sidewall 112s1 may be curved. In some embodiments, the second sidewall 112s2 may be substantially vertical (e.g., oriented at an angle 320 of approximately 90°, as measured through the self-filling spacer 112) with respect to the bottom surface of the self-filling spacer 112.

In some embodiments, the insulating layer 106 may comprise a first portion 106a arranged along an interface with an upper surface of the first material layer 104 and a second portion 106b arranged along an opposing outer surface of the insulating layer 106. The first portion 106a comprises and/or is a first material. The second portion 106b comprises and/or is the first material and one or more additional atoms and/or ions (e.g., argon, oxygen, or the like). For example, the first portion 106a may comprise an insulating material (e.g., an oxide, a nitride, a carbide, or the like), while the second portion 106b may comprise the insulating material (e.g., the oxide, the nitride, the carbide, or the like) along with one or more additional atoms and/or ions (e.g., argon, oxygen, or the like). In some embodiments, the one or more additional atoms and/or ions may comprise a same element that is in the insulating material (e.g., oxygen) so that the second portion 106b has a higher concentration of the element than the first portion 106a.

Figure 3C:
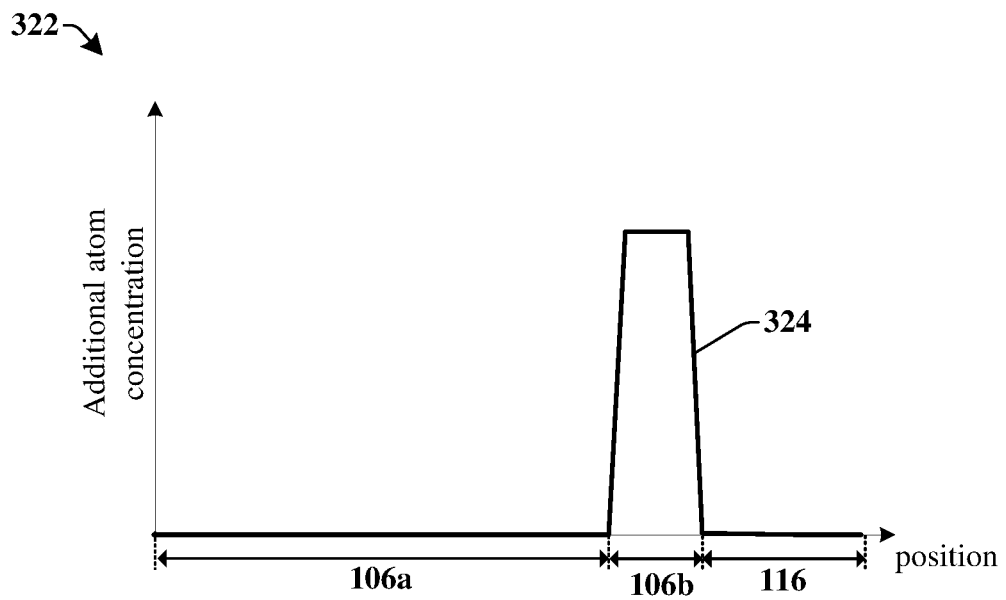

FIG. 3C illustrates a graph 322 showing some embodiments of a concentration 324 of one or more additional atoms and/or ions as a function of position within the insulating layer 106. As shown in graph 322, within the first portion 106a of the insulating layer 106 the concentration 324 of one or more additional atoms and/or ions has a first value that is low (e.g., substantially 0). However, within the second portion 106b of the insulating layer 106 the concentration 324 of the one or more additional atoms and/or ions has a second value that is significantly higher than the first value. The higher concentration of the one or more additional atoms and/or ions is due to a re-deposition of atoms from the insulating layer 106 along with one or more additional atoms and/or ions used to dislodge the atoms from the insulating layer 106.

In some embodiments, the self-filling spacer 112 may be a same material as the second portion 106b of the insulating layer 106. In such embodiments, the self-filling spacer 112 may comprise the first material along with one or more additional atoms and/or ions. In some embodiments, the self-filling spacer 112 may have a maximum width that is larger than a maximum thickness of the second portion 106b of the insulating layer 106. The larger maximum width of the self-filling spacer 112 allows for the insulating layer 106 and the self-filling spacer 112 to form a smooth outer surface.

Figure 4A:
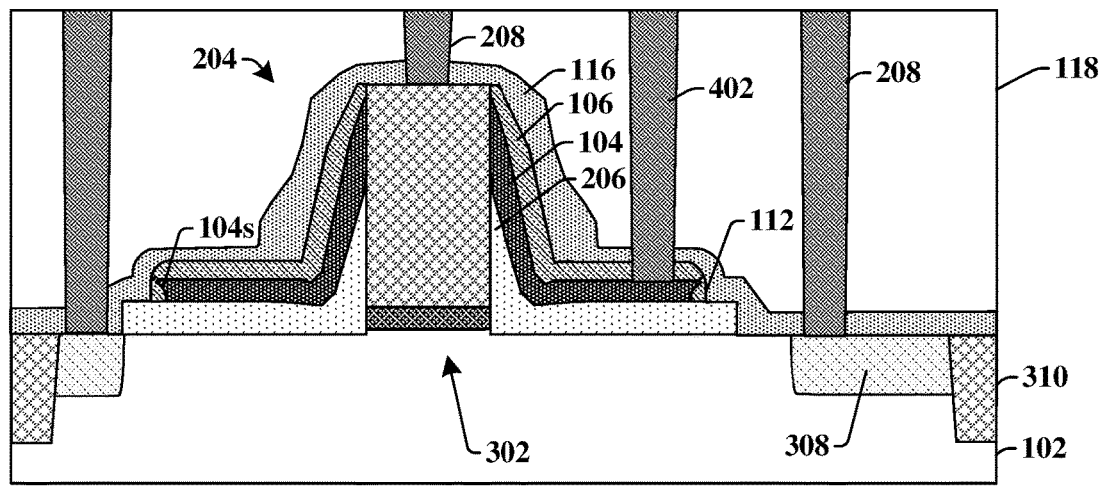
FIGS. 4A-4B illustrate cross-sectional views of some additional embodiments of integrated chip structured comprising a transistor device surrounded by a sidewall spacer having a self-filling spacer.

FIG. 4A illustrates a cross-sectional view of some additional embodiments of an integrated chip structure 400 comprising a transistor device surrounded by a sidewall spacer having a self-filling spacer.

The integrated chip structure 400 comprises a transistor device having a gate structure 302 disposed over a substrate 102. A sidewall spacer 204 is arranged on opposing sides of the gate structure 302. In some embodiments, the sidewall spacer 204 comprises a first material layer 104 arranged between a lower dielectric layer 206 and an insulating layer 106. A self-filling spacer 112 is arranged along an outermost sidewall 104s of the first material layer 104. A dielectric layer 116 is arranged on the insulating layer 106 and a sidewall of the self-filling spacer 112, and an ILD structure 118 is disposed on the dielectric layer 116.

In some embodiments, a field plate contact 402 extends through the ILD structure 118, the dielectric layer 116, and the insulating layer 106 to contact the first material layer 104. In such embodiments, the first material layer 104 is a conductive material, such that the first material layer 104 is configured to act as a field plate for the transistor device. In some embodiments, one or more interconnects 208 (e.g., conductive contacts) extend through the ILD structure 118 to contact the gate structure 302 and source/drain regions 308 on opposing sides of the gate structure 302. The self-filling spacer 112 decreases a chance of metal deposited during formation of the one or more interconnects 208 (e.g., during formation of a conductive contact over the rightmost one of the source/drain regions 308 of FIG. 4A) from being within unwanted cracks in the dielectric layer 116, thereby mitigating electrical shorting between the field plate and a closest source/drain region 308.

Figure 4B:
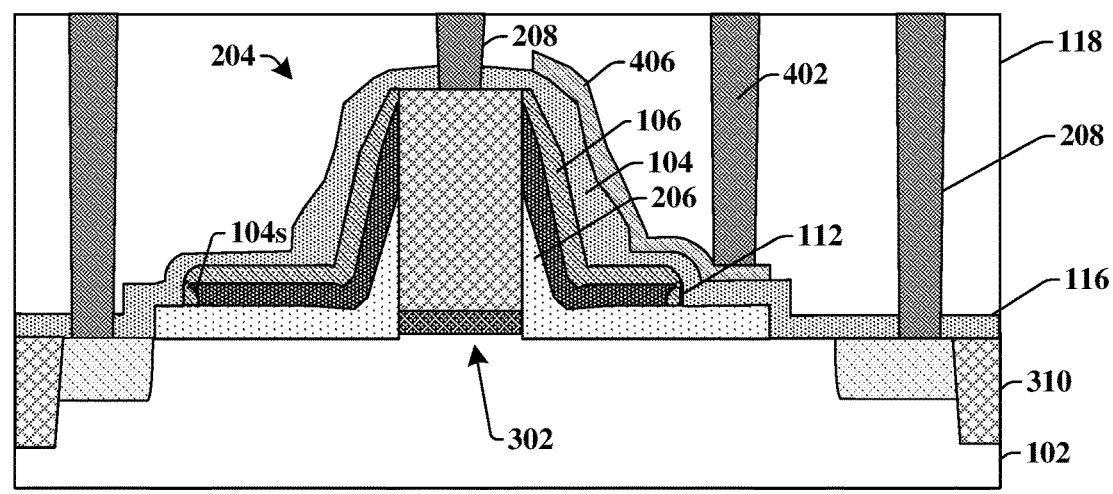

FIG. 4B illustrates a cross-sectional view of some additional embodiments of an integrated chip structure 404 comprising a transistor device surrounded by a sidewall spacer having a self-filling spacer.

The integrated chip structure 404 comprises a transistor device having a gate structure 302 disposed over a substrate 102. A sidewall spacer 204 is arranged on opposing sides of the gate structure 302. In some embodiments, the sidewall spacer 204 comprises a first material layer 104 arranged between a lower dielectric layer 206 and an insulating layer 106. A self-filling spacer 112 is arranged along an outermost sidewall 104s of the first material layer 104. A dielectric layer 116 is arranged on the insulating layer 106 and a sidewall of the self-filling spacer 112, and an ILD structure 118 is disposed on the dielectric layer 116.

A field plate layer 406 is arranged over the dielectric layer 116 and along a side of the gate structure 302. The field plate layer 406 comprises a conductive material, such as copper, aluminum, tungsten, or the like. In some embodiments, a field plate contact 402 extends through the ILD structure 118 to contact the field plate layer 406. In such embodiments, the dielectric layer 116 both laterally and vertically separates the field plate layer 406 from the sidewall spacer 204. The self-filling spacer 112 decreases a chance of metal deposited during formation of the field plate layer 406 from being within unwanted cracks in the dielectric layer 116.

Figure 5:
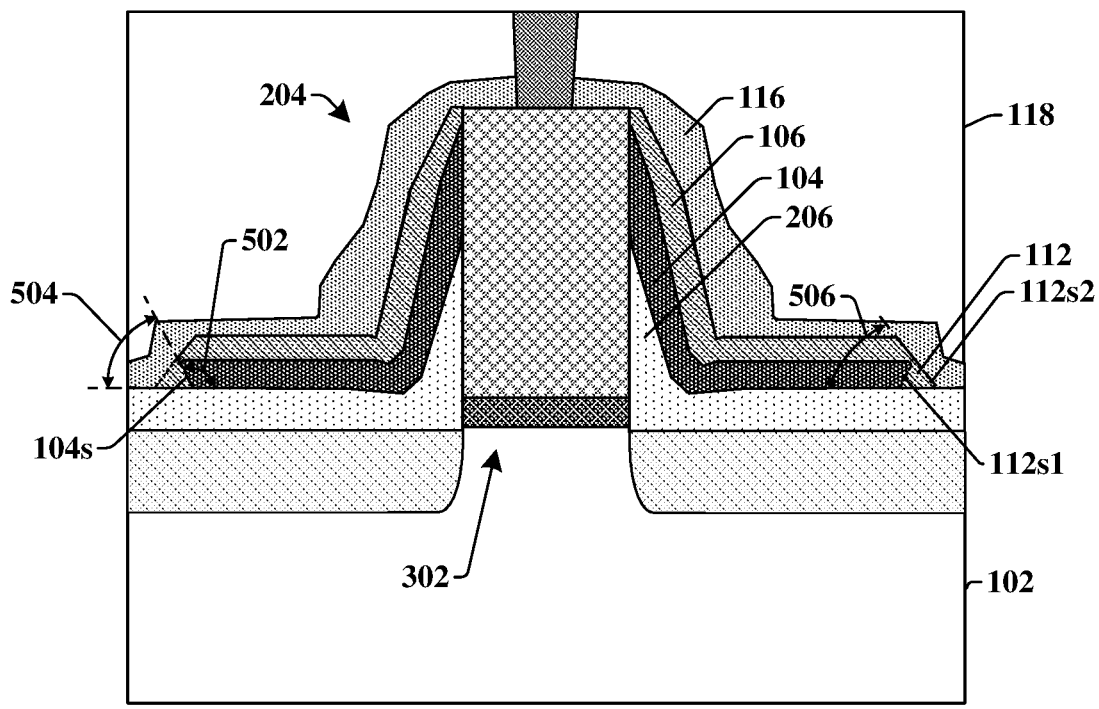
FIG. 5 illustrates a cross-sectional view of some additional embodiments of an integrated chip structure comprising a transistor device surrounded by a sidewall spacer having a self-filling spacer.

FIG. 5 illustrates a cross-sectional view of some additional embodiments of an integrated chip structure 500 comprising a transistor device having a sidewall spacer including a self-filling spacer.

The integrated chip structure 500 comprises a transistor device having a gate structure 302 disposed over a substrate 102. A sidewall spacer 204 is arranged on opposing sides of the gate structure 302. In some embodiments, the sidewall spacer 204 comprises a first material layer 104 arranged between a lower dielectric layer 206 and an insulating layer 106. An outermost sidewall 104s of the first material layer 104 is oriented at an obtuse angle 502 with respect to a bottom of the first material layer 104, as measured through the first material layer 104.

A self-filling spacer 112 is arranged along the outermost sidewall 104s of the first material layer 104. The self-filling spacer 112 comprises a first sidewall 112s1 that abuts the outermost sidewall 104s of the first material layer 104 and a second sidewall 112s2 that faces away from the first material layer 104. In some embodiments, the first sidewall 112s1 and the second sidewall 112s2 may be slanted sidewalls. For example, the first sidewall 112s1 may be oriented at an acute angle 504 with respect to a bottom of the self-filling spacer 112, as measured through the self-filling spacer 112. The second sidewall 112s2 may be oriented at an acute angle 506 with respect to a bottom of the self-filling spacer 112, as measured through the self-filling spacer 112. The acute angle 504 of the first sidewall 112s1 and the acute angle 506 of the second sidewall 112s2 give the self-filling spacer 112 a substantially triangular shape.

Figure 6:
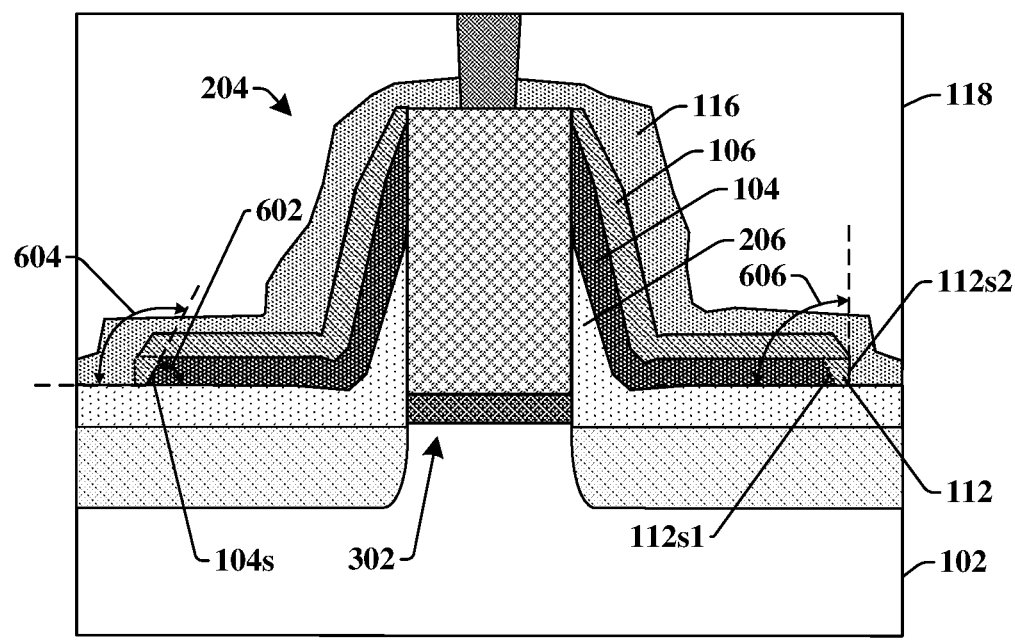
FIG. 6 illustrates a cross-sectional view of some additional embodiments of an integrated chip structure comprising a transistor device surrounded by a sidewall spacer having a self-filling spacer.

FIG. 6 illustrates a cross-sectional view of some additional embodiments of an integrated chip structure 600 comprising a transistor device having a sidewall spacer including a self-filling spacer.

The integrated chip structure 600 comprises a sidewall spacer 204 arranged on opposing sides of a gate structure 302 disposed over a substrate 102. In some embodiments, the sidewall spacer 204 comprises a first material layer 104 arranged between a lower dielectric layer 206 and an insulating layer 106. The first material layer 104 comprises an outermost sidewall 104s that is oriented at an acute angle 602 with respect to a bottom of the first material layer 104, as measured through the first material layer 104.

A self-filling spacer 112 is arranged along the outermost sidewall 104s of the first material layer 104. The self-filling spacer 112 comprises a first sidewall 112s1 that abuts the outermost sidewall 104s of the first material layer 104 and a second sidewall the outermost sidewall 104s 112s2 that faces away from the first material layer 104. In some embodiments, the first sidewall 112s1 may be a slanted sidewall. For example, the first sidewall 112s1 may be oriented at an obtuse angle 604 with respect to a bottom of the self-filling spacer 112, as measured through the self-filling spacer 112. In some embodiments, the second sidewall 112s2 is substantially vertical (e.g., oriented at an angle 606 that is approximately equal to 90°, as measured through the self-filling spacer 112) with respect to a bottom of the self-filling spacer 112. The obtuse angle 604 of the first sidewall 112s1 and the angle 606 of the second sidewall 112s2 give the self-filling spacer 112 an inverted triangular shape.

Figure 7:
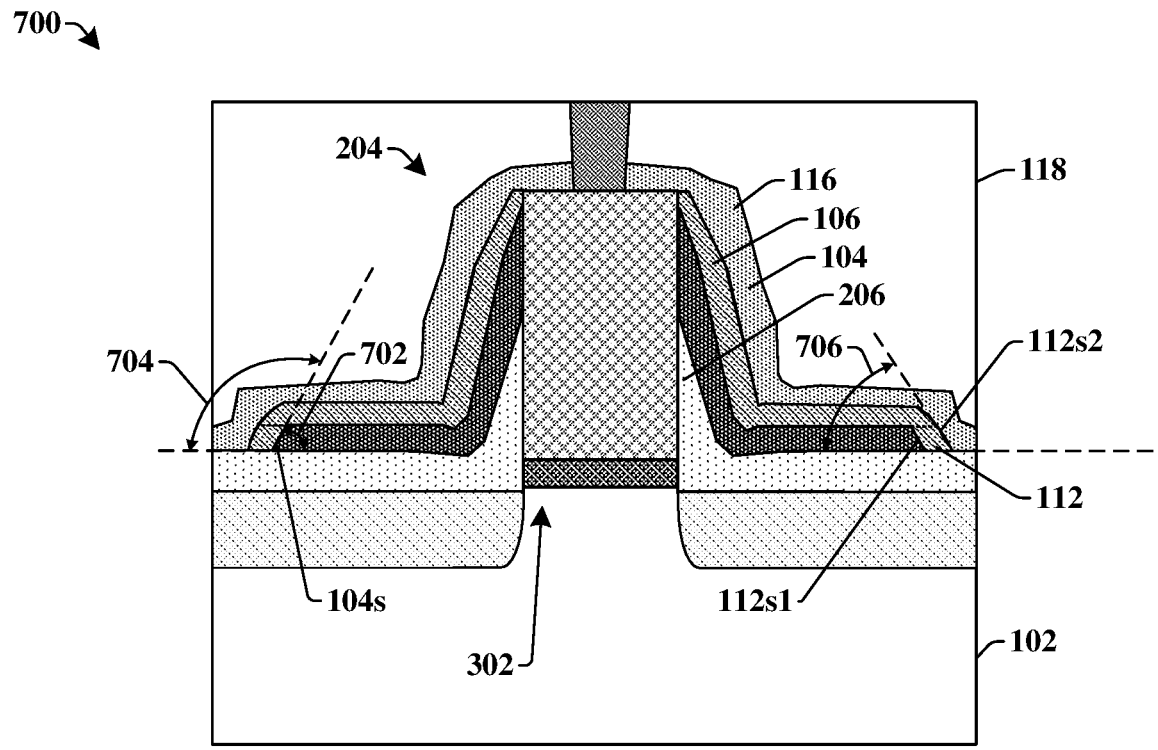
FIG. 7 illustrates a cross-sectional view of some additional embodiments of an integrated chip structure comprising a transistor device surrounded by a sidewall spacer having a self-filling spacer.

FIG. 7 illustrates a cross-sectional view of some additional embodiments of an integrated chip structure 700 comprising a transistor device having a sidewall spacer including a self-filling spacer.

The integrated chip structure 700 comprises a sidewall spacer 204 arranged on opposing sides of a gate structure 302 disposed over a substrate 102. In some embodiments, the sidewall spacer 204 comprises a first material layer 104 arranged between a lower dielectric layer 206 and an insulating layer 106. The first material layer 104 comprises an outermost sidewall 104s that is oriented at an acute angle 702 with respect to a bottom of the first material layer 104, as measured through the first material layer 104.

A self-filling spacer 112 is arranged along the outermost sidewall 104s of the first material layer 104. The self-filling spacer 112 comprises a first sidewall 112s1 that abuts the outermost sidewall 104s of the first material layer 104 and a second sidewall 112s2 that faces away from the first material layer 104. In some embodiments, the first sidewall 112s1 and the second sidewall 112s2 may be slanted sidewalls. For example, the first sidewall 112s1 may be oriented at an obtuse angle 704 with respect to a bottom of the self-filling spacer 112, as measured through the self-filling spacer 112. The second sidewall 112s2 may be oriented at an acute angle 706 with respect to a bottom of the self-filling spacer 112, as measured through the self-filling spacer 112.

Figure 8A:
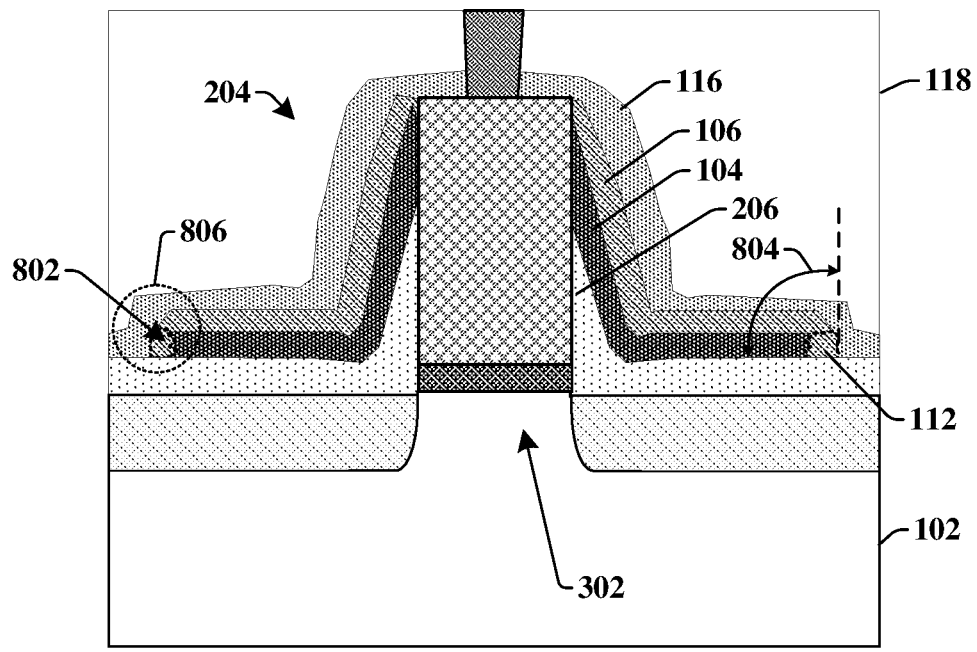
FIGS. 8A-8B illustrate cross-sectional views of some additional embodiments of an integrated chip structure comprising a transistor device surrounded by a sidewall spacer having a self-filling spacer.

FIG. 8A illustrates a cross-sectional view of some additional embodiments of an integrated chip structure 800 comprising a transistor device having a sidewall spacer including a self-filling spacer.

Figure 8B:
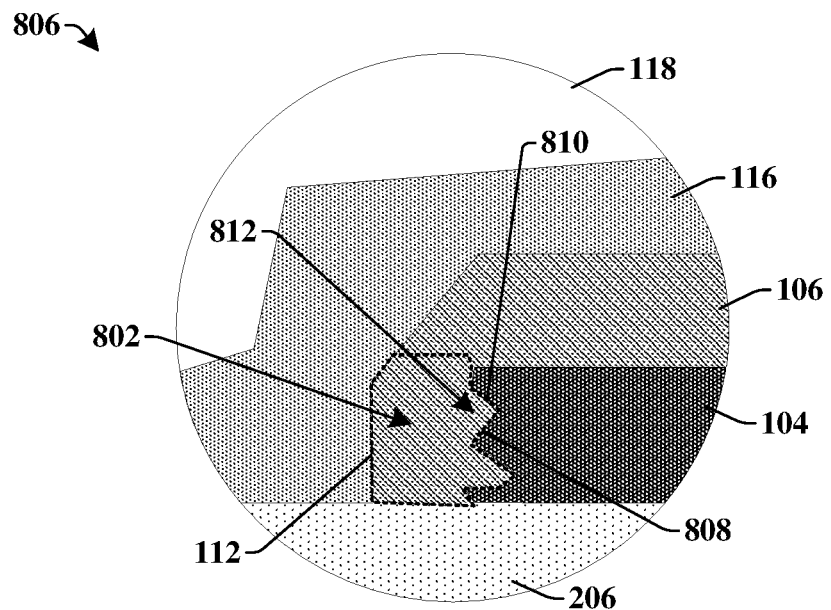

The integrated chip structure 800 comprises a sidewall spacer 204 arranged on opposing sides of a gate structure 302 disposed over a substrate 102. In some embodiments, the sidewall spacer 204 comprises a first material layer 104 arranged between a lower dielectric layer 206 and an insulating layer 106. The first material layer 104 comprises an outermost sidewall having a jagged profile 802. The jagged profile 802 of the first material layer 104 is shown in cross-sectional view 806 of FIG. 8B, which illustrates a part of the integrated chip structure 800 of FIG. 8A. As shown in cross-sectional view 806, the jagged profile of the outermost sidewall comprises surfaces 808-810 that extend along different and intersecting directions to form a plurality of recesses 812 within the outermost sidewall of the first material layer 104.

A self-filling spacer 112 is arranged along the outermost sidewall of the first material layer 104. The self-filling spacer 112 comprises a first sidewall that abuts the outermost sidewall of the first material layer 104 and a second sidewall that faces away from the first material layer 104. In some embodiments, the first sidewall may have a jagged profile that is interlocked with the jagged profile 802 of the first material layer 104.

Figure 9:
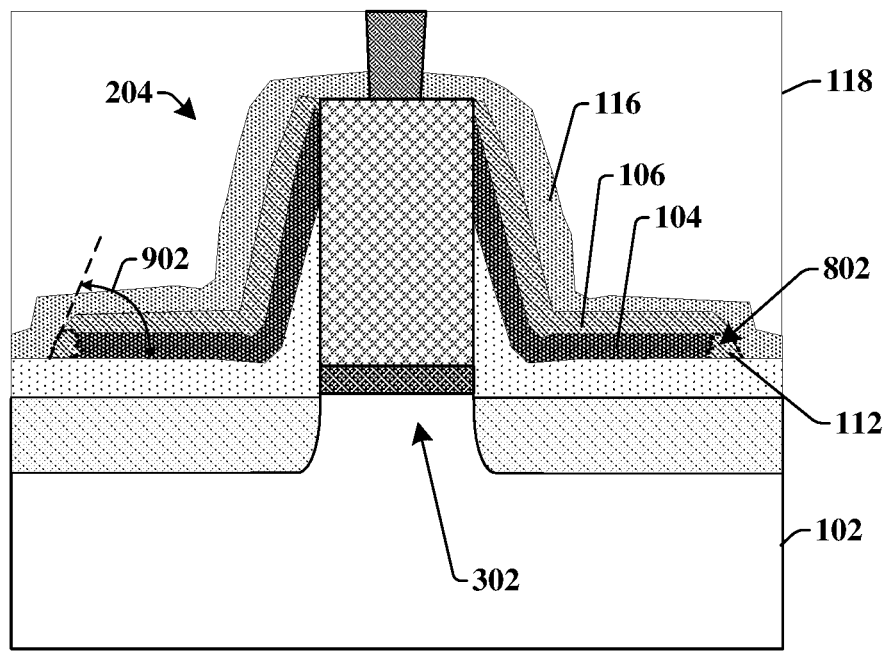
FIG. 9 illustrates a cross-sectional view of some additional embodiments of an integrated chip structure comprising a transistor device surrounded by a sidewall spacer having a self-filling spacer.

In some embodiments, shown in FIG. 8A, the second sidewall of the self-filling spacer 112 is substantially vertical (e.g., oriented at an angle 804 of approximately 90°, as measured through the self-filling spacer 112) with respect to a bottom of the self-filling spacer 112. In other embodiments, illustrated in cross-sectional view 900 of FIG. 9, the second sidewall of the self-filling spacer 112 is oriented at an acute angle 902 with respect to a bottom of the self-filling spacer 112, as measured through the self-filling spacer 112.

Figure 10:
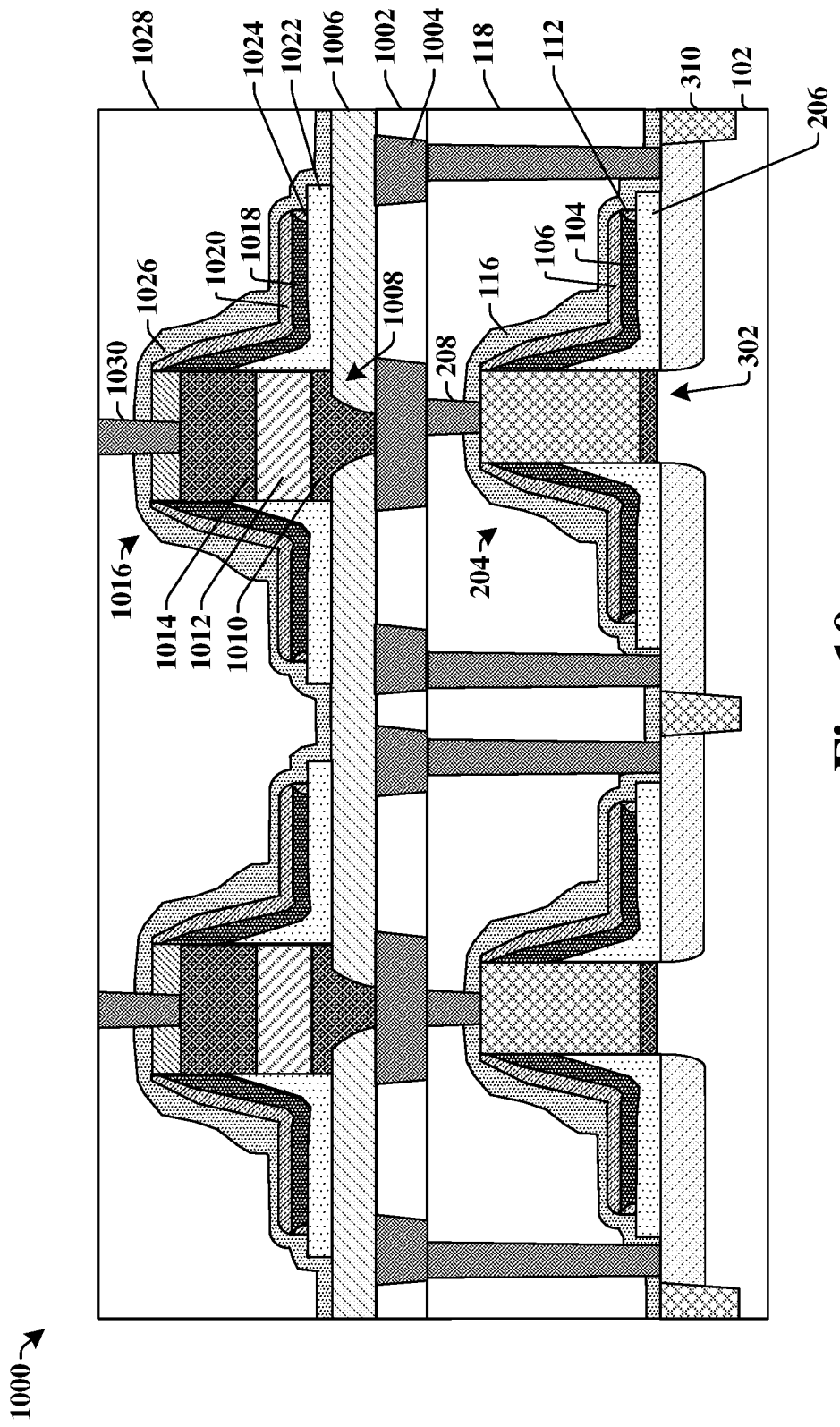
FIG. 10 illustrates a cross-sectional view of some embodiments of an integrated chip structure comprising different types of devices having sidewall spacers respectively including a self-filling spacer.

FIG. 10 illustrates a cross-sectional view of some embodiments of an integrated chip structure 1000 comprising different types of devices having sidewall spacers respectively including a self-filling spacer.

The integrated chip structure 1000 comprises a sidewall spacer 204 arranged on opposing sides of a gate structure 302 disposed over a substrate 102. In some embodiments, the sidewall spacer 204 comprises a first material layer 104 arranged between a lower dielectric layer 206 and an insulating layer 106. A self-filling spacer 112 is arranged along the outermost sidewall of the first material layer 104. A dielectric layer 116 is arranged over the insulating layer 106 and on a sidewall of the self-filling spacer 112. An ILD structure 118 is arranged over the dielectric layer 116. One or more interconnects 208 are arranged within the ILD structure 118.

A first additional ILD structure 1002 is disposed on the ILD structure 118 and a first additional interconnect 1004 is arranged within the first additional ILD structure 1002. In some embodiments, the first additional interconnect 1004 may comprise an interconnect wire including a conductive material (e.g., copper, aluminum, tungsten, or the like). A lower insulating structure 1006 is arranged on the first additional ILD structure 1002. A memory device 1008 is disposed over the lower insulating structure 1006. The memory device 1008 comprises a lower electrode 1010 separated from an upper electrode 1014 by a data storage layer 1012 configured to store a data state. The lower electrode 1010 extends through the lower insulating structure 1006 to contact the first additional interconnect 1004. In some embodiments, the memory device 1008 may comprise an MRAM device, an RRAM device, a CBRAM device, or other similar devices.

A memory device sidewall spacer 1016 is arranged on opposing sides of the memory device 1008. In some embodiments, the memory device sidewall spacer 1016 comprises an additional first material layer 1018 arranged between an additional lower dielectric layer 1022 and an additional insulating layer 1020. An additional self-filling spacer 1024 is arranged along an outermost sidewall of the additional first material layer 1018. An additional dielectric layer 1026 is arranged over the additional insulating layer 1020 and on a sidewall of the additional self-filling spacer 1024. An upper ILD structure 1028 is arranged over the additional dielectric layer 1026. An upper interconnect 1030 is arranged within the upper ILD structure 1028.

It will be appreciated that the integrated chip structure 1000 may be disposed within different packaging types in various embodiments. For example, the integrated chip structure 1000 may be disposed within a SoIC (small outline integrated circuit) package, an InFO (integrated fan out) package, an InFO Pop (integrated fan out package on package) package, a CoWoS (chip on wafer on substrate) package, or the like.

FIGS. 11-18B illustrate cross-sectional views 1100-1804 showing some embodiments of a method of forming an integrated chip structure comprising a transistor device including a sidewall spacer having a self-filling spacer. Although FIGS. 11-18B are described in relation to a method, it will be appreciated that the structures disclosed in FIGS. 11-18B are not limited to such a method, but instead may stand alone as structures independent of the method.

Figure 11:
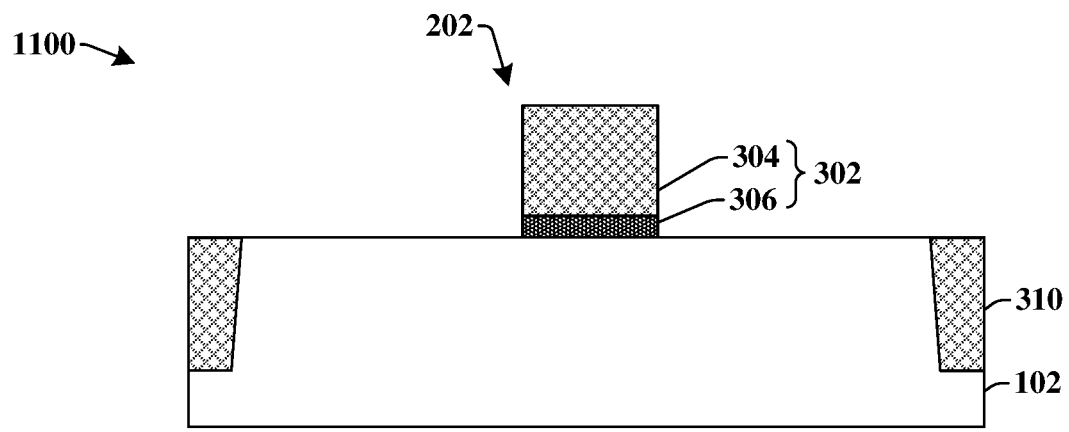
FIGS. 11-18B illustrate cross-sectional views showing some embodiments of a method of forming an integrated chip structure comprising a transistor device surrounded by a sidewall spacer having a self-filling spacer.

As shown in cross-sectional view 1100 of FIG. 11, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 102 may comprise one or more dielectric layers, one or more inter-level dielectric (ILD) layers, and/or one or more interconnects disposed over a semiconductor body.

In some embodiments, a device structure 202 is formed over the substrate 102. In some embodiments, the device structure 202 may comprise a gate structure 302 formed over the substrate 102. In such embodiments, the gate structure 302 may be formed by depositing a gate dielectric 306 over the substrate 102 and depositing a gate electrode 304 over the gate dielectric 306. The gate electrode 304 and the gate dielectric 306 are subsequently patterned to form the gate structure 302. In some embodiments, the gate structure 302 may be formed within an active area defined by one or more isolation structures 310 (e.g., shallow trench isolation (STI) structures) formed within the substrate 102.

Figure 12:
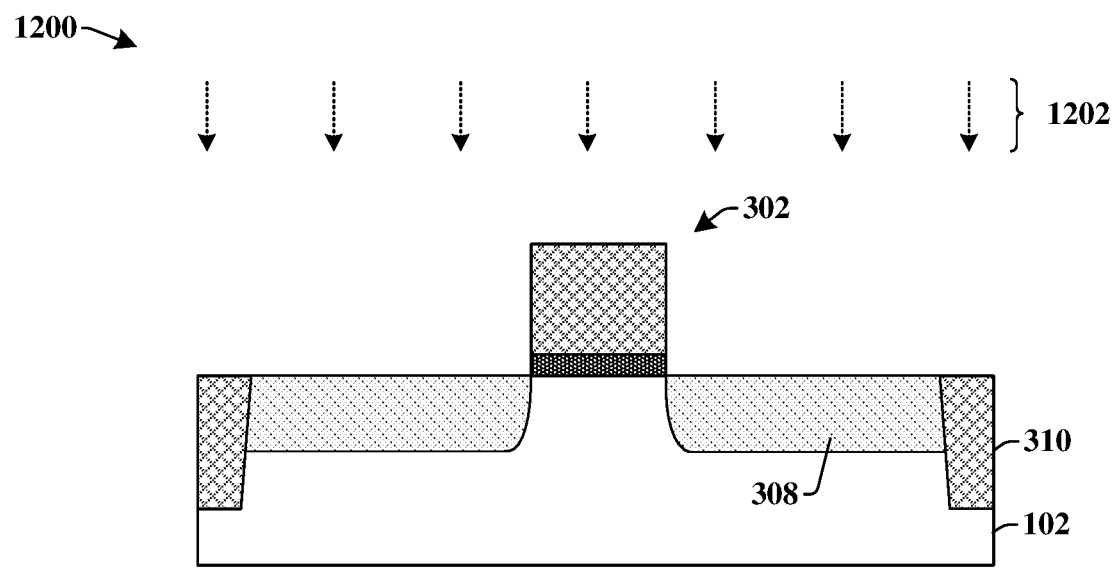

As shown in cross-sectional view 1200 of FIG. 12, dopants 1202 are implanted into the substrate 102 to form source/drain regions 308 on opposing sides of the gate structure 302. In various embodiments, the dopants 1202 may comprise an n-type dopant (e.g., arsenic, phosphorous, or the like) or a p-type dopant (e.g., boron, or the like).

Figure 13:
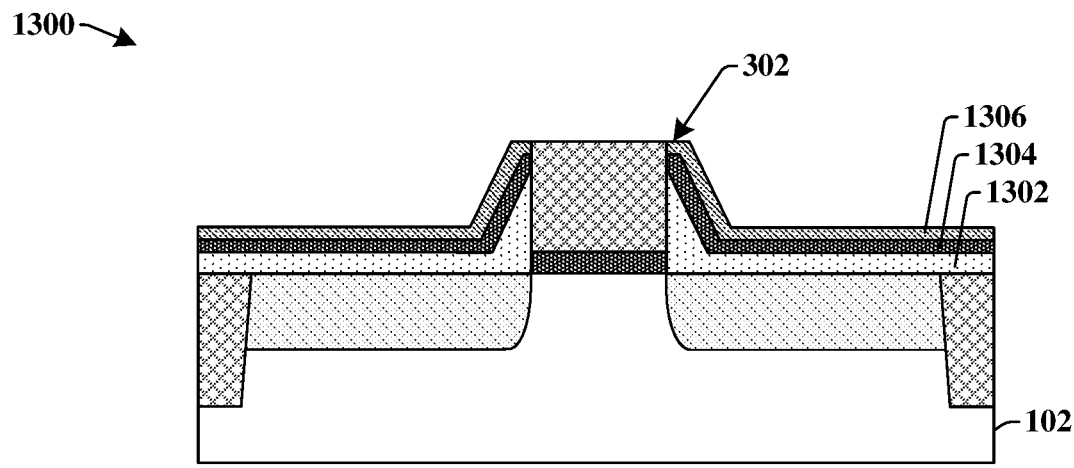

As shown in cross-sectional view 1300 of FIG. 13, an intermediate lower dielectric layer 1302 may be formed over the substrate 102 and along one or more sidewalls of the gate structure 302. An intermediate first material layer 1304 is formed over the intermediate lower dielectric layer 1302 and an intermediate second material layer 1306 is formed onto the intermediate first material layer 1304.

In some embodiments, the intermediate lower dielectric layer 1302, the intermediate first material layer 1304, and the intermediate second material layer 1306 may be formed by deposition processes (e.g., a PVD process, a CVD process, a PE-CVD process, or the like). In some embodiments, the intermediate lower dielectric layer 1302 may be formed by a first deposition process followed by a first etch back process to recess the intermediate lower dielectric layer 1302 below a top of the gate structure 302. In some embodiments, the intermediate first material layer 1304 may be formed by a second deposition process followed by a second etch back process to recess the intermediate first material layer 1304 below the top of the gate structure 302. In some embodiments, the intermediate second material layer 1306 may be formed by a third deposition process followed by a third etch back process to recess the intermediate second material layer 1306 below the top of the gate structure 302.

Figure 14:
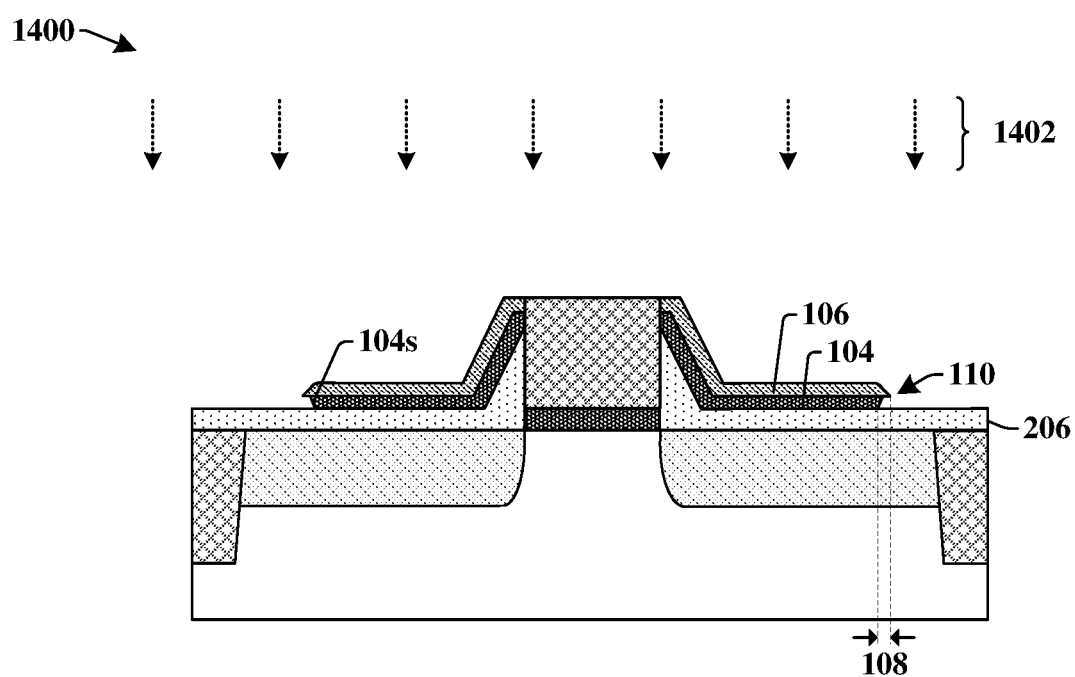

As shown in cross-sectional view 1400 of FIG. 14, one or more etching processes are performed on the intermediate first material layer (e.g., 1304 of FIG. 13) to form a first material layer 104 and on the intermediate second material layer (e.g., 1306 of FIG. 13) to form an insulating layer 106. The one or more etching processes are configured to laterally etch the intermediate first material layer faster than the intermediate second material layer, thereby causing the first material layer 104 to have an outermost sidewall 104s that is indented (e.g., laterally recessed) from an outermost sidewall of the insulating layer 106 by a non-zero distance 108. The recessed outermost sidewall of the first material layer 104 along with a lower surface of the insulating layer 106 defines a cavity 110 that is directly below the insulating layer 106.

In various embodiments, the one or more etching processes may be performed by exposing the intermediate first material layer and/or the intermediate material layer to one or more etchants 1402. In some embodiments, the one or more etchants 1402 may comprise a dry etchant used in a dry etching process, a wet etchant used in a wet etching process, or a combination thereof. For example, in some embodiments, the intermediate second material layer may be etched according to a dry etching process and the intermediate first material layer may be etched according to a wet etching process. In some embodiments, the wet etching process may comprise a hydrogen fluoride (HF) etchant that is used to remove the intermediate second material layer to expose the substrate 102. Because the intermediate first material layer and the intermediate second material layer are different materials having different etching selectivities, the intermediate first material layer will laterally etch at a faster rate than the intermediate second material layer thereby causing the outermost sidewall 104s of the first material layer 104 to be laterally indented from an outermost sidewall of the insulating layer 106. In other embodiments, the intermediate first material layer and the intermediate second material layer may be both etched according to a dry etching process or according to a wet etching process. In some embodiments, the first etching process and the second etching process may comprise a same etching process (e.g., a single dry etching process or a single wet etching process).

Figure 15:
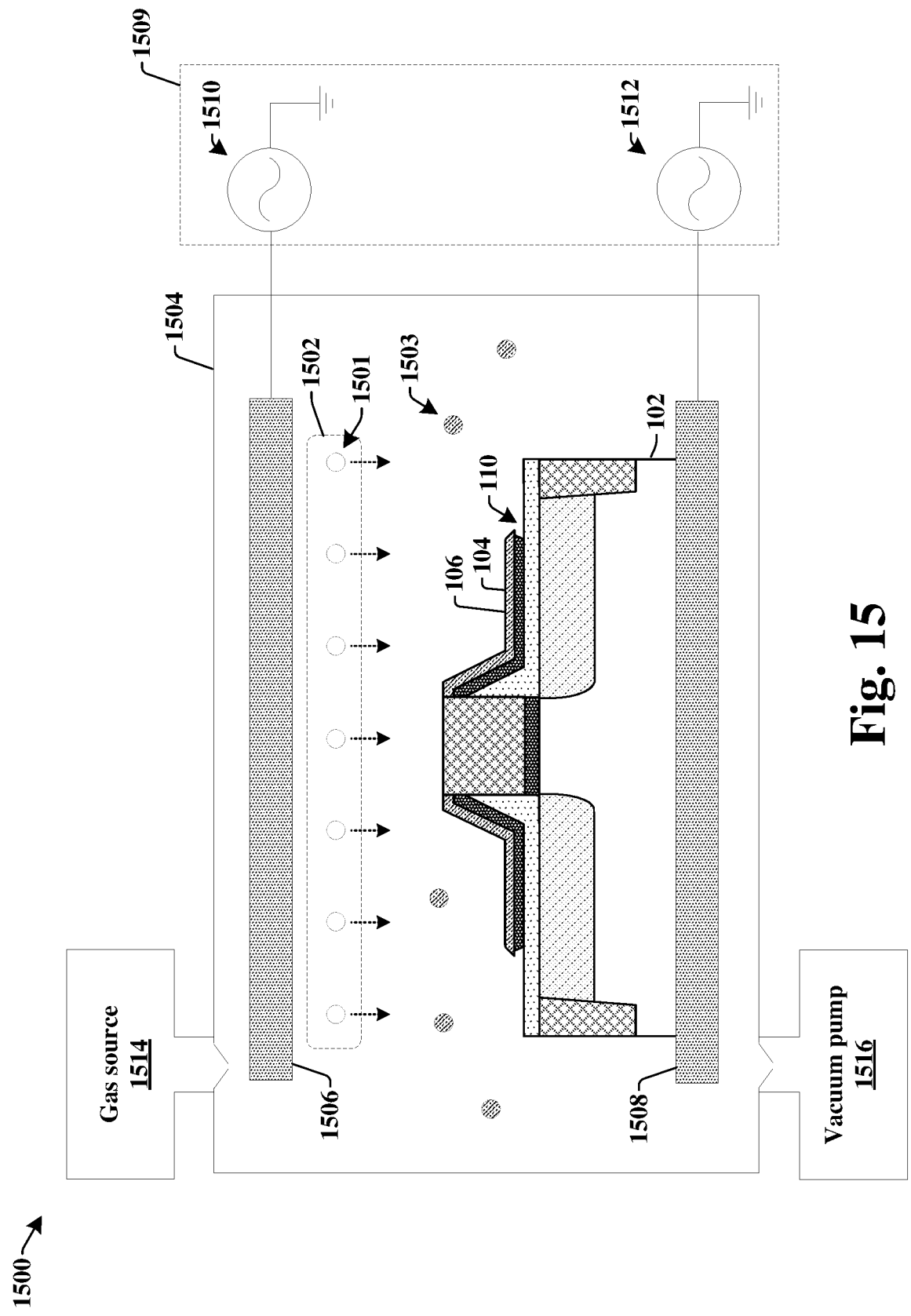

As shown in cross-sectional view 1500 of FIG. 15, atoms 1503 (e.g., ions) are removed from the insulating layer 106. In some embodiments, the atoms 1503 may be ionized and removed from the insulating layer 106 by way of an ion bombardment process. In such embodiments, ions 1501 within a plasma 1502 may be accelerated towards the insulating layer 106. When the ions 1501 contact the insulating layer 106, they will ionize and/or knock away atoms 1503 from the insulating layer 106. In various embodiments, the ions 1501 may comprise argon ions, oxygen ions, or the like. In some embodiments, the insulating layer 106 may be bombarded with an ion dose that is in a range of between approximately $0.8 \times 10^{11}$ ions/cm$^3$ and approximately $1.5 \times 10^{11}$ ions/cm$^3$. Removing the atoms 1503 from the insulating layer 106 reduces a thickness of the insulating layer 106 from a first thickness to a second thickness that is less than the first thickness.

In some embodiments, the atoms 1503 may be removed by generating a conductively coupled plasma (CCP) within a process chamber 1504. In some embodiments, the CCP may be generated using a high frequency CCP plasma system comprising a first electrode 1506 and a second electrode 1508 arranged on opposing sides of the substrate 102 and coupled to a power system 1509. In some embodiments, the first electrode 1506 is coupled to a first power source 1510 and the second electrode 1508 is coupled to a second power source 1512. The first power source 1510 may comprise a high frequency power source configured to operate at a first frequency (e.g., approximately 60 MHz) and the second power source 1512 may comprise a low frequency power source configured to operate at a second frequency (e.g., approximately 2 MHz) that is less than the first frequency. In some embodiments, the first electrode 1506 and the second electrode 1508 may be operated to ignite the plasma 1502 from a working gas (e.g., an argon gas, an oxygen gas, or the like) introduced into the process chamber 1504 from a gas source 1514 at a flow rate that is in a range of between approximately 100 sccm (standard cubic centimeters per minute) and approximately 500 sccm. In some embodiments, the first power source 1510 and the second power source 1512 may respectively operate on the working gas at a power that is in a range of between approximately 50 Watts (W) and approximately 600 W. In some embodiments, the process chamber 1504 may be held at a temperature that in a range of between approximately 55° C. and approximately 65° C.

Figure 16:
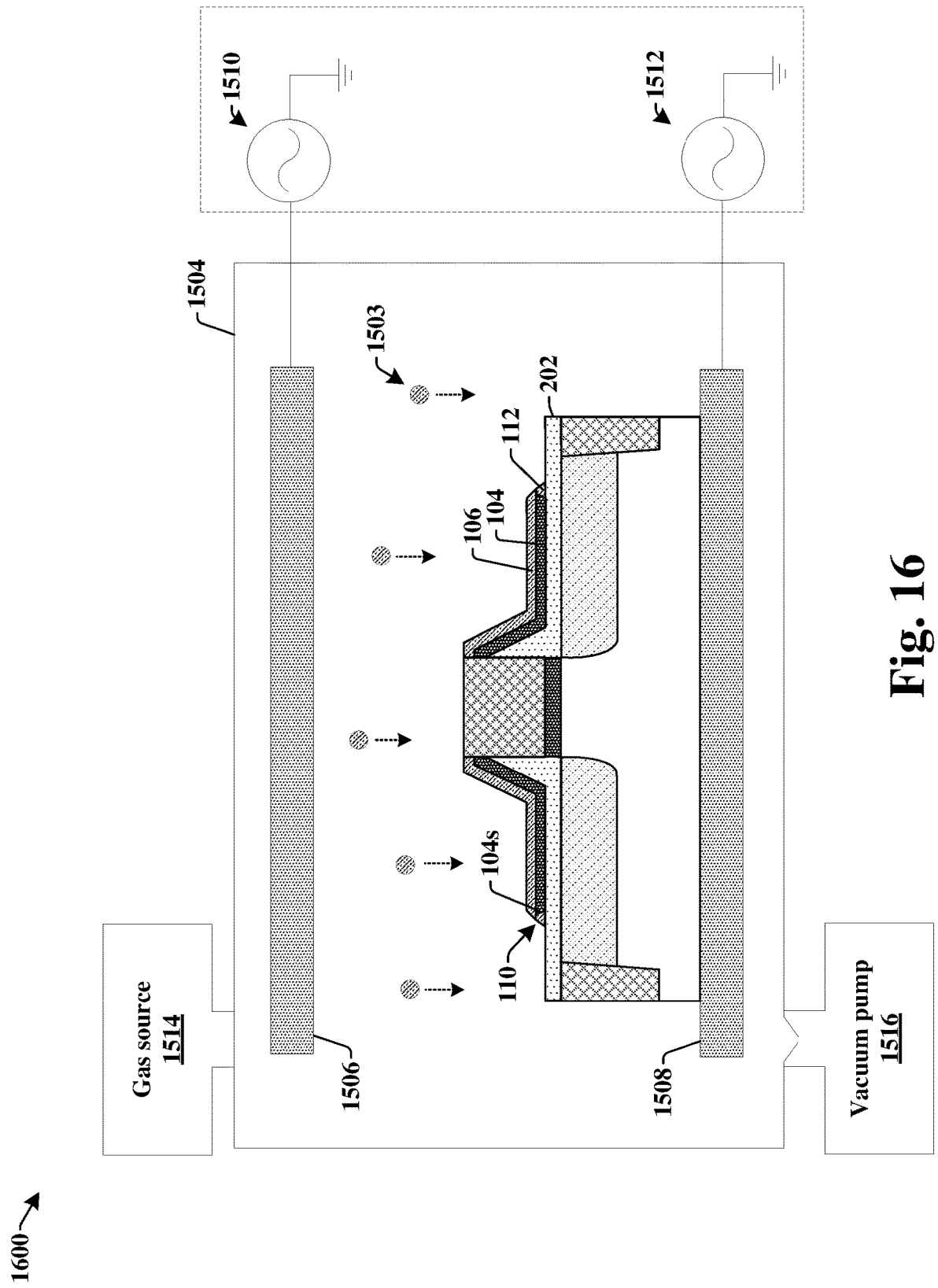

As shown in cross-sectional view 1600 of FIG. 16, the atoms 1503 that were ionized and/or removed from the insulating layer 106 are re-deposited along the outermost sidewall 104s of the first material layer 104 to form a self-filling spacer 112 within the cavity 110. The self-filling spacer 112 comprises at least one of the same materials as the insulating layer 106. In some embodiments, the self-filling spacer 112 may also comprise one or more additional materials (e.g., argon, oxygen, or the like) from the ions used in the ion bombardment process (shown in FIG. 15).

In some embodiments, the atoms 1503 that were removed from the insulating layer 106 are also re-deposited onto the insulating layer 106, so that re-deposited material continuously extends from within the cavity 110 to along a sidewall and/or upper surface of the insulating layer 106. In such embodiments, outer surfaces of the insulating layer may have a higher concentration of the one or more additional materials (e.g., argon, oxygen, or the like) than interior regions of the insulating layer 106. In some embodiments, the atoms 1503 may be re-deposited in-situ with removing the atoms 1503 from the insulating layer 106. In some embodiments, the re-deposition of the atoms 1503 that were removed from the insulating layer 106 increases a thickness of the insulating layer 106 from the second thickness to a third thickness.

In some embodiments, the atoms 1503 may be re-deposited by applying a first power to the first electrode 1506 and a second power to the second electrode 1508. In some embodiments, the first power may be in a range of between approximately 50 W and approximately 600 W. In some embodiments, the second power may be in a range of between approximately 50 W and approximately 400 W. In some embodiments, the process chamber 1504 may be held at a temperature that in a range of between approximately 55° C. and approximately 65° C. during the re-deposition process. In some embodiments, a vacuum pump 1516 may be operated to hold the process chamber 1504 at a pressure that is in a range of between approximately 30 mTorr and approximately 150 mTorr, during the re-deposition process.

In some embodiments, the self-filling spacer 112 may be formed by way of a plurality of cycles respectively comprising an ion bombardment process (e.g., as shown in FIG. 15) followed by a re-deposition process (e.g., as shown in FIG. 16). By performing a plurality of such cycles, the re-deposited material can be formed to a greater thickness within the cavity 110 than over the insulating layer 106, thereby resulting in a smooth surface along sides of the insulating layer 106 and the self-filling spacer 112. This is because the ion bombardment process within each of the cycles will remove the re-deposited material from an upper surface and sidewall of the insulating layer 106 at a greater rate than within the cavity 110.

Figure 17:
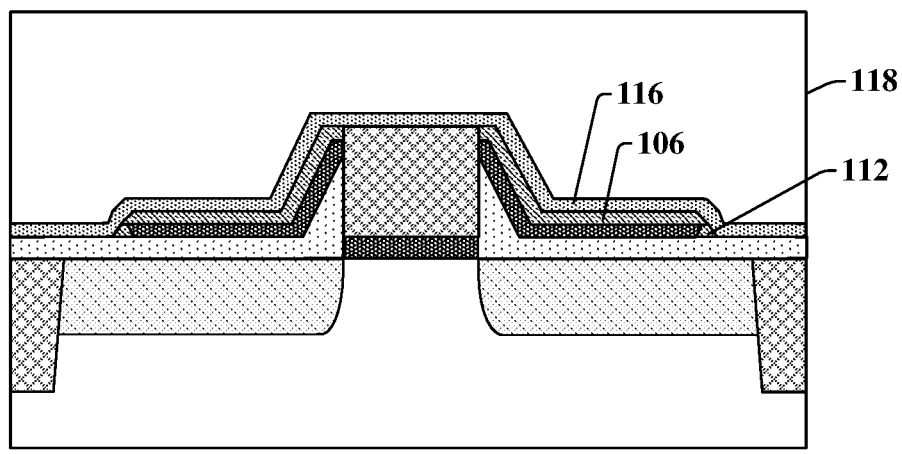

As shown in cross-sectional view 1700 of FIG. 17, a dielectric layer 116 is formed over the insulating layer 106 and along sidewalls of the insulating layer 106 and the self-filling spacer 112. The dielectric layer 116 may comprise an oxide, a nitride, a carbide, or the like. The dielectric layer 116 continuously extends from along the sidewall of the self-filling spacer 112 to over the insulating layer 106. Because the self-filling spacer 112 fills the cavity 110 and forms a smooth surface with the insulating layer 106, a stress on the dielectric layer 116 during formation is reduced so that cracks in the dielectric layer 116 are mitigated. In some embodiments, the dielectric layer 116 is substantially devoid of cracks. Mitigating cracks in the dielectric layer 116 improves performance and/or reliability of the integrated chip structure. In some embodiments, the dielectric layer 116 may be formed by a deposition process (e.g., a PVD process, a CVD process, a PE-CVD process, or the like). In some embodiments, one or more metal silicide portions may be formed above the device structure 202 and/or the source/drain regions 308 before the dielectric layer 116 is formed, and the metal silicide portions will contact the following-formed one or more interconnects 208 (e.g., one or more contacts).

In some embodiments an ILD structure 118 may be formed over the dielectric layer 116. In some embodiments, the ILD structure 118 may be formed by way of a deposition process (e.g., a PVD process, a CVD process, a PE-CVD process, or the like). In various embodiments, the ILD structure 118 may comprise one or more of silicon dioxide, carbon doped silicon oxide (SiCOH), phosphosilicate glass (PSG), borophosphosilicate glass (BPSG), fluorosilicate glass (FSG), undoped silicate glass (USG), or the like As shown in cross-sectional view 1800 and 1804 of FIGS. 18A-18B, one or more interconnects 208 may be formed within the ILD structure 118.

Figure 18A:
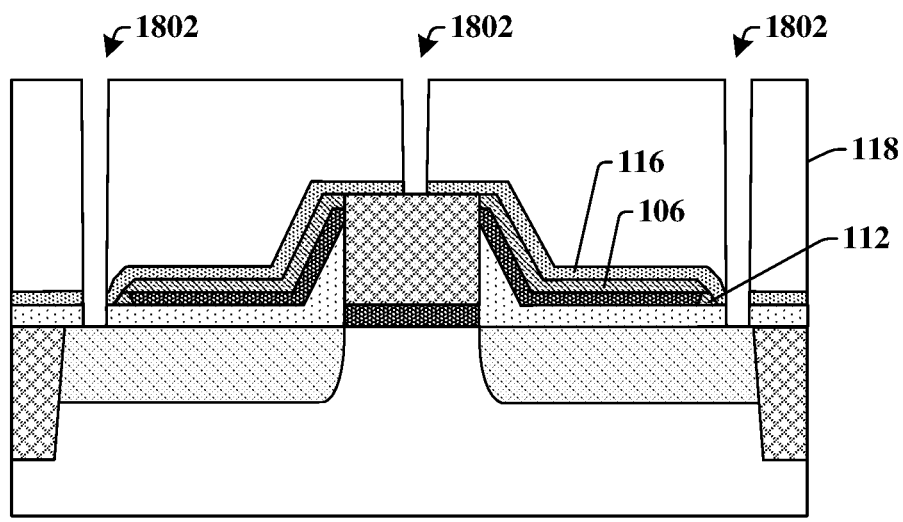

In some embodiments, shown in cross-sectional view 1800 of FIG. 18A, the one or more interconnects 208 may be formed by performing a patterning process that defines one or more openings 1802 (e.g., a via hole and/or trench) within the ILD structure 118. In some embodiments, the dielectric layer 116 is directly and laterally between the self-filling spacer 112 and a closest one of the one or more openings 1802. In some embodiments, the dielectric layer 116 defines a sidewall of the one or more openings 1802.

Figure 18B:
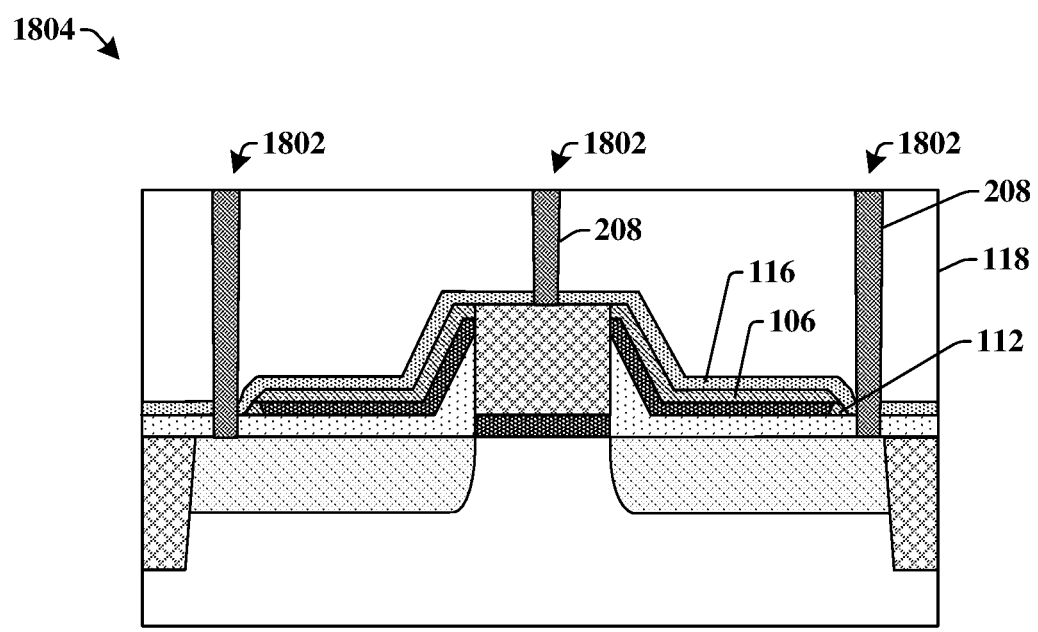

In some embodiments, shown in cross-sectional view 1804 of FIG. 18B, one or more conductive materials are disposed within the one or more openings 1802. Because the self-filling spacer 112 mitigates cracks within the dielectric layer 116, the one or more conductive materials do not fill in cracks within the dielectric layer, thereby mitigating reliability problems. A planarization process (e.g., a CMP process) is subsequently performed to remove excess of the one or more conductive materials and define the one or more interconnects 208 within the ILD structure 118. In some embodiments, the one or more conductive materials may comprise aluminum, copper, tungsten, or the like.

Figure 19:
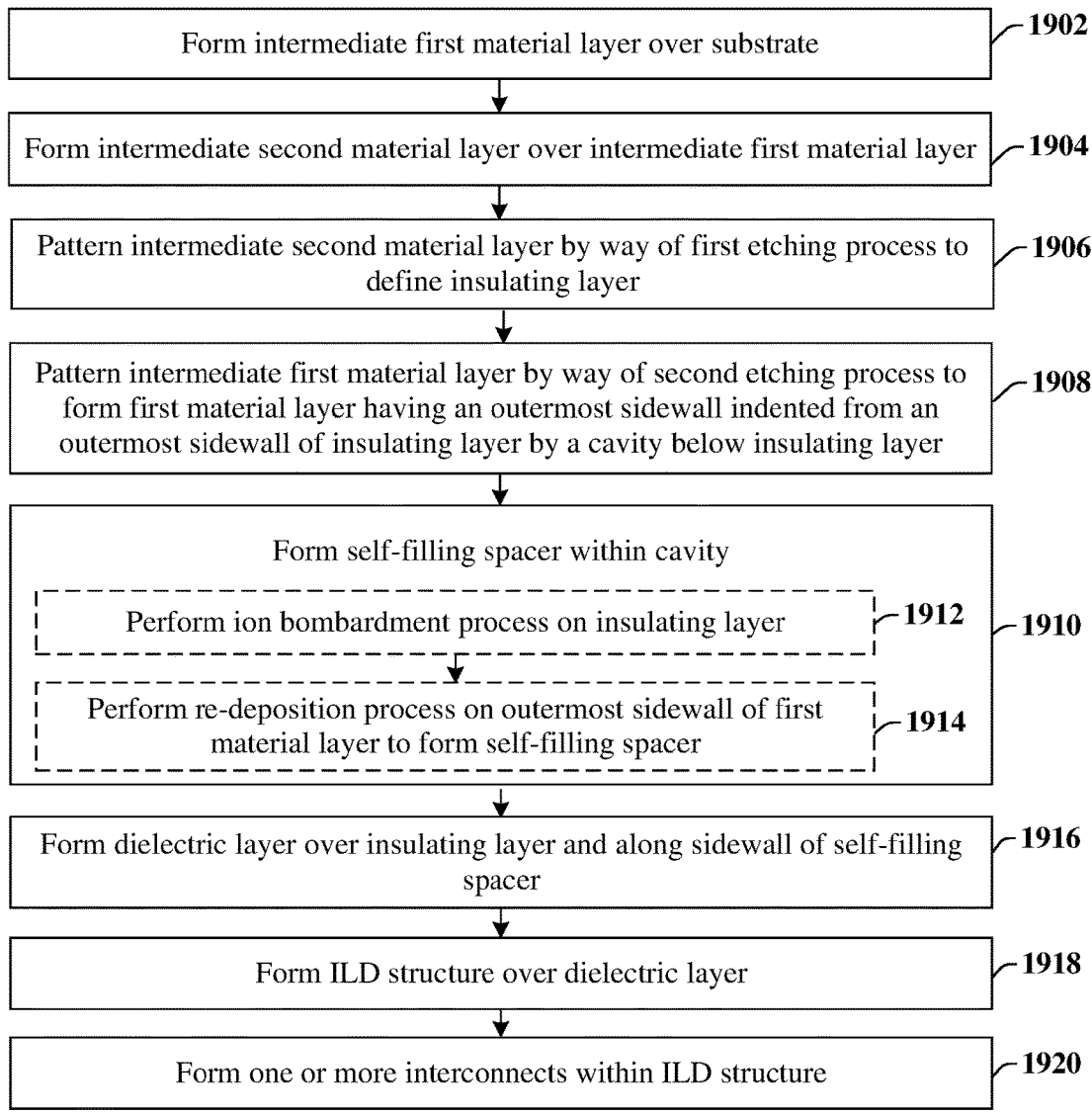
FIG. 19 illustrates a flow diagram of some embodiments of a method of forming an integrated chip structure comprising a dual-film structure having a self-filling spacer.

FIG. 19 illustrates a flow diagram of some embodiments of a method 1900 of forming an integrated chip structure comprising a self-filling spacer.

While method 1900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, an intermediate first material layer is formed over a substrate. FIG. 13 illustrates a cross-sectional view 1300 of some embodiments corresponding to act 1902.

At act 1904, an intermediate second material layer is formed over the intermediate first material layer. FIG. 13 illustrates a cross-sectional view 1300 of some embodiments corresponding to act 1904.

At act 1906, the intermediate second material layer is patterned by way of a first etching process to form an insulating layer. FIG. 14 illustrates a cross-sectional view 1400 of some embodiments corresponding to act 1906.

At act 1908, the intermediate first material layer is patterned by way of a second etching process to form a first material layer having an outermost sidewall that is indented from an outermost sidewall of the insulating layer. The second etching process forms a cavity below the insulating layer. In various embodiments, the first etching process and the second etching process may be different etching processes or a same etching process. FIG. 14 illustrates a cross-sectional view 1400 of some embodiments corresponding to act 1908.

At act 1910, a self-filling spacer is formed within the cavity. In some embodiments, the self-filling spacer may be formed by way of acts 1912-1914.

At act 1912, an ion bombardment process is performed on the insulating layer to dislodge atoms and/or ions from the insulating layer. FIG. 14 illustrates a cross-sectional view 1400 of some embodiments corresponding to act 1912.

At act 1914, a re-deposition process is performed to re-deposit the atoms and/or ions from the insulating layer along the outermost sidewall of the first material layer to form the self-filling spacer. FIG. 15 illustrates a cross-sectional view 1500 of some embodiments corresponding to act 1914.

At act 1916, a dielectric layer is formed over the insulating layer and along a sidewall of the self-filling spacer. FIG. 16 illustrates a cross-sectional view 1600 of some embodiments corresponding to act 1916.

At act 1918, an inter-level dielectric (ILD) structure is formed over the dielectric layer. FIG. 17 illustrates a cross-sectional view 1700 of some embodiments corresponding to act 1918.

At act 1920, one or more interconnects may be formed within the ILD structure. FIGS. 18A-18B illustrate cross-sectional views, 1800 and 1804, of some embodiments corresponding to act 1920.

Accordingly, in some embodiments, the present disclosure relates to an integrated chip structure comprising a self-filling spacer that is configured to fill a cavity, which was formed within a sidewall of a dual-film structure during an etching process, to mitigate stress on a layer overlying the dual-film structure.

In some embodiments, the present disclosure relates to a method of manufacturing an integrated chip structure. The method includes forming an intermediate first material layer over a substrate; forming an intermediate second material layer on the intermediate first material layer; patterning the intermediate second material layer to form an insulating layer; patterning the intermediate first material layer to form a first material layer having an outermost sidewall indented inward from an outermost sidewall of the insulating layer; performing an ion bombardment process on the insulating layer to dislodge one or more atoms from the insulating layer; and performing a re-deposition process to re-deposit the one or more atoms onto the outermost sidewall of the first material layer and to form a self-filling spacer below the insulating layer. In some embodiments, the intermediate first material layer includes a conductive material. In some embodiments, the intermediate first material layer includes a non-conductive material. In some embodiments, the intermediate second material layer includes a dielectric material. In some embodiments, the self-filling spacer includes a first sidewall in contact with the first material layer and a second sidewall opposite to the first sidewall, the second sidewall including a substantially vertical sidewall with respect to a bottom of the self-filling spacer. In some embodiments, the self-filling spacer includes a first sidewall in contact with the first material layer and a second sidewall opposite to the first sidewall, the second sidewall including a slanted sidewall with respect to a bottom of the self-filling spacer. In some embodiments, the ion bombardment process and the re-deposition process are performed in-situ. In some embodiments, performing the ion bombardment process includes igniting a plasma from an argon gas to form argon ions; and bombarding the insulating layer with the argon ions. In some embodiments, performing the ion bombardment process includes igniting a plasma from an oxygen gas to form oxygen ions; and bombarding the insulating layer with the oxygen ions.

In other embodiments, the present disclosure relates to a method of manufacturing an integrated chip structure. The method includes forming a device structure over a substrate; forming a first dielectric layer along a sidewall of the device structure; forming an intermediate first material layer on the first dielectric layer; forming an intermediate second material layer on the intermediate first material layer; patterning the intermediate second material layer to form an insulating layer; patterning the intermediate first material layer to form a first material layer having an outermost sidewall laterally set back from an outermost sidewall of the insulating layer by a cavity that is below the insulating layer, the cavity wrapping around an outer perimeter of the first material layer as viewed in a top view; forming a self-filling spacer within the cavity after patterning the intermediate first material layer; and forming a dielectric layer over the self-filling spacer and the insulating layer. In some embodiments, forming the self-filling spacer within the cavity includes performing an ion bombardment process on the insulating layer to dislodge atoms from the insulating layer; and performing a re-deposition process to deposit the atoms on the outermost sidewall of the first material layer and form the self-filling spacer. In some embodiments, a top of the self-filling spacer has a first width and a bottom of the self-filling spacer has a second width that is greater than the first width. In some embodiments, the self-filling spacer has a tilted edge. In some embodiments, the outer sidewall of the first material layer is oriented at an acute angle as measured through the first material layer and with respect to a bottom of the first material layer. In some embodiments, the outer sidewall of the first material layer is oriented at an obtuse angle as measured through the first material layer and with respect to a bottom of the first material layer. In some embodiments, the outer sidewall of the first material layer has a serrated texture. In some embodiments, the insulating layer overhangs the self-filling spacer. In some embodiments, the insulating layer includes a first portion arranged along an interface with the first material layer and a second portion arranged along an opposing outer surface of the insulating layer, the first portion having a first material and the second portion having the first material and one or more additional materials.

In yet other embodiments, the present disclosure relates to an integrated chip structure. The integrated chip structure includes a first material layer disposed over a substrate and having an outermost sidewall; an insulating layer disposed over the first material layer, the insulating layer laterally extending from directly over the first material layer to laterally past the outermost sidewall of the first material layer so as to define a cavity that is below the insulating layer; a self-filling spacer arranged within the cavity and having at least one of a same material as the insulating layer; and a dielectric layer arranged over the insulating layer and along an outermost sidewall of the self-filling spacer. In some embodiments, the self-filling spacer includes a first sidewall in contact with the first material layer and a second sidewall opposite to the first sidewall, the second sidewall including a slanted sidewall with respect to a bottom of the self-filling spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated chip structure, comprising:
    forming an intermediate first material layer over a substrate;
    forming an intermediate second material layer on the intermediate first material layer;
    patterning the intermediate second material layer to form an insulating layer;
    patterning the intermediate first material layer to form a first material layer having an outermost sidewall indented inward from an outermost sidewall of the insulating layer to form a cavity below the insulating layer; and
    forming a self-filling spacer along the outermost sidewall of the first material layer and within the cavity, wherein the self-filling spacer is formed by way of a first cycle that removes material from the insulating layer and re-deposits the removed material as re-deposited material onto the outermost sidewall of the first material layer and over an upper surface of the insulating layer and a second cycle that removes the re-deposited material from the upper surface of the insulating layer at a greater rate than within the cavity.

2. The method of claim 1,
    wherein removing the material from the insulating layer reduces a thickness of the insulating layer from a first thickness to a second thickness that is less than the first thickness; and
    wherein re-depositing the removed material increases the thickness of the insulating layer from the second thickness to a third thickness that is greater than the second thickness.

3. The method of claim 1, wherein a first power is applied to a first electrode below the substrate and a second power is applied to a second electrode over the substrate during re-depositing the removed material.

4. The method of claim 1, wherein the self-filling spacer comprises a first sidewall in contact with the first material layer and a second sidewall opposite to the first sidewall, wherein the second sidewall comprises a slanted sidewall with respect to a bottom of the self-filling spacer.

5. The method of claim 1, wherein outer surfaces of the insulating layer have a higher concentration of one or more additional materials than interior regions of the insulating layer.

6. The method of claim 1, further comprising:
    igniting a plasma from an argon gas to form argon ions; and
    bombarding the insulating layer with the argon ions.

7. A method of manufacturing an integrated chip structure, comprising:
    forming a device structure over a substrate;
    forming a first dielectric layer along a sidewall of the device structure;
    forming an intermediate first material layer on the first dielectric layer;
    forming an intermediate second material layer on the intermediate first material layer;
    patterning the intermediate second material layer to form an insulating layer;
    patterning the intermediate first material layer, after forming and patterning the intermediate second material layer, to form a first material layer having an outermost sidewall laterally set back from an outermost sidewall of the insulating layer by a cavity that is below the insulating layer; and
    forming a self-filling spacer within the cavity after patterning the intermediate first material layer.

8. The method of claim 7, wherein forming the self-filling spacer within the cavity comprises:
    performing an ion bombardment process on the insulating layer to dislodge atoms from the insulating layer, wherein the atoms dislodged from the insulating layer are configured to re-deposit on the outermost sidewall of the first material layer to form the self-filling spacer.

9. The method of claim 7, wherein the self-filling spacer has a topmost surface vertically below a lower surface of the insulating layer, an outermost sidewall of the self-filling spacer facing away from the device structure and being laterally outside of the insulating layer and entirely vertically below the lower surface of the insulating layer.

10. The method of claim 9, further comprising:
    a dielectric layer having a sidewall that physically contacts the outermost sidewall of the self-filling spacer laterally outside of the insulating layer.

11. The method of claim 7, wherein the outer sidewall of the first material layer is oriented at an obtuse angle as measured through the first material layer and with respect to a bottom of the first material layer.

12. The method of claim 7, further comprising:
forming an inter-level dielectric layer over and along sidewalls of the first dielectric layer.

13. The method of claim 7, wherein the insulating layer overhangs the self-filling spacer.

14. The method of claim 7, wherein the insulating layer includes a first portion arranged along an interface with the first material layer and a second portion arranged along an opposing outer surface of the insulating layer, the first portion comprising a first material and the second portion having the first material and one or more additional materials.

15. The method of claim 1, wherein the self-filling spacer laterally extends from the outermost sidewall of the first material layer to the outermost sidewall of the insulating layer.

16. A method of manufacturing an integrated chip structure: comprising:
forming an intermediate first material layer over a substrate;
forming an intermediate second material layer on a sidewall and an upper surface of the intermediate first material layer;
etching the intermediate second material layer to form an insulating layer;
etching the intermediate first material layer to form a first material layer having an outermost sidewall set back from an outermost sidewall of the insulating layer by a cavity that is below the insulating layer; and
dislodging atoms from the insulating layer after etching the intermediate first material layer, wherein the atoms dislodged from the insulating layer re-deposit below the insulating layer and completely cover an entirety of the outermost sidewall of the first material layer.

17. The method of claim 16,
wherein dislodging the atoms from the insulating layer reduces a thickness of the insulating layer from a first thickness to a second thickness that is less than the first thickness; and
wherein the atoms dislodged from the insulating layer are further re-deposited onto the insulating layer to increase the thickness of the insulating layer from the second thickness to a third thickness that is greater than the second thickness.

18. The method of claim 16, further comprising:
forming a device structure over the substrate, wherein the intermediate first material layer is formed along a sidewall of the device structure; and
wherein an entirety of the intermediate second material layer is vertically below a topmost surface of the device structure.

19. The method of claim 16, wherein the first intermediate material layer and the second intermediate material layer are etched by a single etching process, the first intermediate material layer and the second intermediate material layer having different etching selectivities with respect to an etchant of the single etching process.

20. The method of claim 16, wherein etching the intermediate second material layer forms the outermost sidewall of the insulating layer to be directly over the upper surface of the intermediate first material layer.

* * * * *